US012721040B2

(12) United States Patent
Littrell

(10) Patent No.: US 12,721,040 B2
(45) Date of Patent: Aug. 25, 2026

(54) PIEZOELECTRIC MICROMACHINED ULTRASONIC TRANSDUCER (PMUT) DESIGN

(71) Applicant: QUALCOMM Incorporated, San Diego, CA (US)

(72) Inventor: Robert John Littrell, Belmont, MA (US)

(73) Assignee: QUALCOMM Incorporated, San Diego, CA (US)

( * ) Notice: Subject to any disclaimer, the term of this patent is extended or adjusted under 35 U.S.C. 154(b) by 672 days.

(21) Appl. No.: 18/174,536

(22) Filed: Feb. 24, 2023

(65) Prior Publication Data

US 2023/0270011 A1 Aug. 24, 2023

Related U.S. Application Data

(60) Provisional application No. 63/316,238, filed on Mar. 3, 2022, provisional application No. 63/313,571, filed on Feb. 24, 2022.

(51) Int. Cl.
*H10N 30/20* (2023.01)
*B81B 3/00* (2006.01)
(Continued)

(52) U.S. Cl.
CPC ....... *H10N 30/2042* (2023.02); *B81B 3/0021* (2013.01); *H10N 30/2044* (2023.02);
(Continued)

(58) Field of Classification Search
CPC ............... G01H 11/08; H10N 30/2042; H10N 30/2044; H10N 30/503; H10N 30/853;
(Continued)

(56) References Cited

U.S. PATENT DOCUMENTS 5,888,845 A * 3/1999 Bashir ................. B81C 1/00158 257/E21.026
11,099,078 B1 8/2021 Littrell
(Continued)

FOREIGN PATENT DOCUMENTS

| | | | |
|---|---|---|---|
| CN | 110475191 A | 11/2019 | |
| EP | 3201122 A1 | 8/2017 | |
| JP | 2020136385 A * | 8/2020 | ............. H04R 17/02 |

OTHER PUBLICATIONS

Partial International Search Report—PCT/US2023/063292—ISA/EPO—Jun. 2, 2023.

(Continued)

*Primary Examiner* — Moazzam Hossain
(74) *Attorney, Agent, or Firm* — Polsinelli

(57) ABSTRACT

Aspects include piezoelectric acoustic transducers and systems for acoustic transduction. In some aspects, an acoustic transducer is structured with a silicon substrate having a top surface and a bottom surface, where the top surface has a first portion and an edge along the first portion associated with an acoustic aperture. The transducer has a first silicon oxide layer disposed over the first portion of the top surface of the silicon substrate, a polysilicon layer disposed over the first silicon oxide layer, and a second silicon oxide layer disposed over the polysilicon layer. A cantilevered beam comprising a fixed end, a deflection end, a top surface, and a bottom surface, has a first portion of the bottom surface at the fixed end disposed over the second silicon oxide layer, where a second portion of the bottom surface at the deflection end is formed over the acoustic aperture. In some aspects, transducer elements are reconfigurable between parallel and serial configurations depending on a system operating mode.

27 Claims, 12 Drawing Sheets

(51) Int. Cl.
*H10N 30/50* (2023.01)
*H10N 30/853* (2023.01)
*H10N 30/87* (2023.01)

(52) U.S. Cl.
CPC ......... *H10N 30/503* (2023.02); *H10N 30/853* (2023.02); *H10N 30/875* (2023.02); *B81B 2201/032* (2013.01); *B81B 2203/0118* (2013.01); *B81B 2203/04* (2013.01)

(58) Field of Classification Search
CPC .. H10N 30/875; B81B 3/0021; B06B 1/0622; H04R 17/00; H04R 17/02
See application file for complete search history.

(56) References Cited

U.S. PATENT DOCUMENTS

2006/0186762 A1 8/2006 Sugiura et al.
2015/0097468 A1 4/2015 Hajati et al.
2015/0350792 A1* 12/2015 Grosh .................... H10N 30/50 257/416
2017/0021391 A1* 1/2017 Guedes ................. B06B 1/0603
2020/0194659 A1 6/2020 Giusti et al.
2021/0047176 A1* 2/2021 Cheng ................... B81B 7/0029
2021/0050506 A1* 2/2021 Xia ...................... H10N 30/708
2021/0160623 A1* 5/2021 Littrell ................... H04R 17/02
2021/0177378 A1 6/2021 Goericke et al.
2021/0193899 A1 6/2021 Qian et al.
2022/0367784 A1* 11/2022 Chen .................... H10N 30/871
2023/0011561 A1* 1/2023 Qian ...................... H04R 31/00
2023/0130082 A1* 4/2023 Qian .................... H10N 30/306
2023/0270012 A1 8/2023 Littrell

OTHER PUBLICATIONS

International Search Report and Written Opinion—PCT/US2023/063292—ISA/EPO—Sep. 4, 2023.

* cited by examiner

PIEZOELECTRIC MICROMACHINED ULTRASONIC TRANSDUCER (PMUT) DESIGN

CROSS-REFERENCE TO RELATED APPLICATIONS

This application claims the benefit of U.S. Provisional Application No. 63/313,571, filed Feb. 24, 2022, titled "PMUT DESIGN IMPROVEMENTS FOR PERFORMANCE AND MANUFACTURABILITY," and U.S. Provisional Application No. 63/316,238, filed Mar. 3, 2022, titled "PMUT DESIGN IMPROVEMENTS FOR PERFORMANCE AND MANUFACTURABILITY," which are hereby incorporated by reference, in entirety and for all purposes.

TECHNICAL FIELD

This disclosure relates generally to acoustic transducers, and more specifically to piezoelectric micromachined ultrasonic transducer (PMUT) devices and systems designed with improvements for increased performance and manufacturability.

BACKGROUND

MEMS technology has enabled the development of smaller transducers using wafer deposition techniques. In general, MEMS transducers can take various forms including, for example, touch sensors, capacitive microphones, and piezoelectric microphones. MEMS transducers designed to operate at ultrasonic frequencies can be referred to as micromachined ultrasonic transducers (MUTs). Such MEMS devices include capacitive MUTs (CMUTs) fabricated using parallel plate capacitors on an acoustic membrane. CMUTs are frequently used for medical imaging. Ultrasonic MEMS also include piezoelectric MUTs (PMUTs), which can include with a polysilicon membrane and conductor stack including portions having a Molybdenum/Aluminum Nitride/Molybdenum conductor stack.

SUMMARY

Various implementations of systems, methods, and devices within the scope of the appended claims each have several aspects, no single one of which is solely responsible for the desirable attributes described herein. Without limiting the scope of the appended claims, some prominent features are described herein. Aspects described herein include devices, wireless communication apparatuses, circuits, and modules supporting piezoelectric MEMS transducers.

One aspect is an acoustic transducer. The acoustic transducer comprises a silicon substrate having a top surface and a bottom surface, where the top surface has a first portion and an edge along the first portion associated with an acoustic aperture; a first silicon oxide layer disposed over the first portion of the top surface of the silicon substrate; a polysilicon layer disposed over the first silicon oxide layer; a second silicon oxide layer disposed over the polysilicon layer; and a cantilevered beam comprising a fixed end, a deflection end, a top surface, and a bottom surface, where a first portion of the bottom surface at the fixed end of the cantilevered beam is disposed over the second silicon oxide layer, where a second portion of the bottom surface at the deflection end is formed over the acoustic aperture.

Some such aspects are configured where the cantilevered beam comprises a first piezoelectric layer and a second piezoelectric layer separated by a conductor layer. Some such aspects are configured where the cantilevered beam further comprises a top conductor layer and a bottom conductor layer, where the first piezoelectric layer and the second piezoelectric layer are between the top conductor layer and the bottom conductor layer of the cantilevered beam. Some such aspects are configured where the first piezoelectric layer and the second piezoelectric layer comprise Aluminum Nitride (AlN), and where the top conductor layer, the bottom conductor layer, and the conductor layer comprise Molybdenum (Mo). Some such aspects are configured where the cantilevered beam comprises a triangle having a base at the fixed end and a tip at the deflection end. Some such aspects are configured where the cantilevered beam has a length from the base to the tip of 144 micrometers. Some such aspects are configured where a thickness of the first piezoelectric layer and a thickness of the second piezoelectric layer is approximately 500 nanometers (nm), where a thickness of each of the top conductor layer, the bottom conductor layer, and the conductor layer is approximately 20 nm, and where the acoustic transducer has a resonance frequency of approximately 160 kilohertz (kHz). Some such aspects are configured where the acoustic transducer has an average transmit displacement of approximately of 12.6 nanometers per volt (nm/V) and an approximate receive sensitivity of 130 microvolts per pascal (uV/Pa).

Some such aspects are configured where the first piezoelectric layer and the second piezoelectric layer are formed of Aluminum Scandium Nitride (AlN). Some such aspects are configured where the top conductor layer, the bottom conductor layer, and the conductor layer are formed of Platinum. Some such aspects are configured where the cantilevered beam comprises a triangle having a base at the fixed end and a tip at the deflection end, with a length from the base to the tip of 115 micrometers. Some such aspects are configured where a thickness of the first piezoelectric layer and a thickness of the second piezoelectric layer is approximately 400 nanometers (nm), and where the acoustic transducer has a resonance frequency of approximately 161 kilohertz (kHz). Some such aspects are configured where the acoustic transducer has an average transmit volume displacement of approximately of 39 nm/V and an approximate receive sensitivity of 187 uV/Pa.

Some such aspects are configured further include a plurality of cantilevered beams including the cantilevered beam, each of the plurality of cantilevered beams comprising a corresponding fixed end, a corresponding deflection end, a corresponding top surface, and a corresponding bottom surface; where the corresponding fixed end of each of the plurality of cantilevered beams is formed on the polysilicon layer over the first portion of the silicon substrate; and where the corresponding deflection end of each of the plurality of cantilevered beams is formed over the acoustic aperture.

Some such aspects are configured where the corresponding top surface of each of the plurality of cantilevered beams is a rectangular shape.

Some such aspects are configured where the corresponding top surface of each of the plurality of cantilevered beams is a triangular shape with a triangle base at the corresponding fixed end and a tip a the corresponding deflection end; and where the plurality of cantilevered beams and gaps between adjacent beams of the plurality of cantilevered beams enclose a symmetrical polygonal shape.

Some such aspects are configured where the cantilevered beam comprises a conductive contact electrically coupled to at least one conductor layer of the cantilevered beam.

Some such aspects are configured further comprising an application specific integrated circuit (ASIC) coupled to the conductive contact via a bond wire.

Some such aspects further include a package lid and a package substrate surrounding the cantilevered beam, where the silicon substrate is mounted to the package substrate.

Some such aspects are configured where the package substrate comprises a portion of the acoustic aperture configured to provide an acoustic path to the cantilevered beam. Some such aspects are configured where the acoustic aperture forms a via through the silicon substrate.

Some such aspects further include processing circuitry and a display screen coupled to the ASIC.

Some such aspects are configured where an edge of the first silicon oxide layer, an edge of the polysilicon layer and an edge of the second silicon oxide layer formed by top-side etching align with the edge of the silicon substrate along a boundary between the first portion of the bottom surface of the cantilevered beam and the second portion of the bottom surface of the cantilevered beam.

Some such aspects are configured where the edge of the second silicon oxide layer modifies a resonance of the acoustic transducer by modifying a resonance frequency of the cantilevered beam.

Another aspect is an acoustic transducer or PMUT. The acoustic transducer or PMUT comprises: a silicon substrate having a top surface and a bottom surface, where the top surface has a first portion and an edge associated with an acoustic aperture; a first silicon oxide layer formed over the first portion of the top surface of the silicon substrate; a polysilicon layer formed over the silicon oxide layer; a second silicon oxide layer formed over the polysilicon layer; and a plurality of cantilevered beams each comprising a fixed end, a deflection end, a top surface, and a bottom surface, where the fixed end of each cantilevered beam is disposed on the second silicon oxide layer and formed over the first portion of the silicon substrate, and where the deflection end of each cantilevered beam is formed over the acoustic aperture.

Some such aspects further include a package lid and a package substrate surrounding the cantilevered beam, where the silicon substrate is mounted to the package substrate; and where the package substrate comprises an acoustic aperture configured to provide an acoustic path to the plurality of cantilevered beams.

Some such aspects are configured where the acoustic transducer is a piezoelectric micromachined ultrasonic transducer (PMUT) device configured to operate with an ultrasonic resonance frequency at or above 40 kilohertz (kHz).

Another aspect is method of forming an acoustic transducer. The method includes: forming a silicon substrate having a top surface and a bottom surface, where the top surface has a first portion and a second portion different from the first portion; forming a first silicon oxide layer disposed over the top surface of the silicon substrate; removing the first silicon oxide layer over the second portion of the top surface of the silicon substrate; forming a polysilicon layer disposed over the silicon oxide layer and the second portion of the top surface of the silicon substrate; forming a second silicon oxide layer disposed over the polysilicon layer; forming a cantilevered beam comprising a fixed end, a deflection end, a top surface, and a bottom surface, where a portion of the bottom surface at the fixed end of the cantilevered beam is disposed over the second silicon oxide layer, and where a cantilever gap is formed over the second portion of the silicon substrate between the bottom surface of the cantilevered beam and the top surface of the silicon substrate; and forming an acoustic aperture by removing a portion of the polysilicon layer, a portion of the second silicon oxide layer, and a portion of the silicon substrate aligned with the second portion of the top surface of the silicon substrate. Some such aspects are configured where the acoustic aperture is formed using top-side etching through the first silicon oxide layer, the polysilicon layer and the second silicon oxide layer and bottom-side etching through the silicon substrate to form an edge of the acoustic aperture.

Another aspect is a piezoelectric micromachined ultrasonic transducer (PMUT) device. The PMUT device comprises a cantilevered beam comprising a fixed end, a deflection end, a top surface, and a bottom surface; and means for supporting the fixed end of the cantilevered beam having an edge formed by a top-side etch process to provide an accurate length of the deflection end of the cantilevered beam.

Another aspect is a device. The device comprises a transmit signal path node; a receive signal path node; a first electrode layer coupled to a first piezoelectric layer, the first electrode layer having a transducer connection point and a reference voltage connection point, where the reference voltage connection point is coupled to a reference node; a second electrode layer coupled to a second piezoelectric layer, the second electrode layer having a transducer connection point and a reference voltage connection point; and switching circuitry; where the switching circuitry is configurable to couple the first electrode layer and the second electrode layer in series between the reference node and the receive signal path node in a first configuration and to couple the first electrode layer and the second electrode layer in parallel between the reference node and the transmit signal path node in a second configuration.

Some such aspects are configured where the first electrode layer and the second electrode layer are positioned together with the first piezoelectric layer and the second piezoelectric layer in a single cantilevered beam.

Some such aspects further include a first cantilevered beam comprising the first electrode layer and the first piezoelectric layer; and a second cantilevered beam comprising the second electrode layer and the second piezoelectric layer.

Some such aspects are configured where the switching circuitry comprises: a first switch having a first input node, a second input node, and a output node, where the first input node is coupled to the transmit signal path node, and where the output node is coupled to the transducer connection point of the first cantilevered beam; a second switch having a first input node, a second input node, and a output node, where the first input node is coupled to the reference node, and where the second input node is coupled to the second input node of the first switch; and a third switch having a first input node, a second input node, and a output node, where the first input node is coupled to the transmit signal path node, where the second input node is coupled to the receive signal path node, and where the output node is coupled to the transducer connection point of the second cantilevered beam.

Some such aspects further include a third cantilevered beam having a transducer connection point and a reference voltage connection point.

Some such aspects are configured where the switching circuitry comprises: a first switch having a first input node, a second input node, and a output node, where the first input node is coupled to the transmit signal path node, and where the output node is coupled to the transducer connection point of the first cantilevered beam; a second switch having a first input node, a second input node, and a output node, where the first input node is coupled to the reference node, where the second input node is coupled to the second input node of the first switch, and where the output node is coupled to the reference voltage connection point of the second switch; a third switch having a first input node, a second input node, and a output node, where the first input node is coupled to the transmit signal path node, and where the output node is coupled to the transducer connection point of the second cantilevered beam; a fourth switch having a first input node, a second input node, and a output node, where the first input node is coupled to the reference node, and where the second input node is coupled to the second input node of the second switch, and where the output node is coupled to the reference voltage connection point of the third switch; and a fifth switch having a first input node, a second input node, and a output node, where the first input node is coupled to the transmit signal path node, where the second input node is coupled to the receive signal path node, and where the output node is coupled to the transducer connection point of the third cantilevered beam.

Some such aspects further include a first set of cantilevered beams, a second set of cantilevered beams, and a third set of cantilevered beams; where the first set of cantilevered beams comprises the first cantilevered beam; where the second set of cantilevered beams comprises the second cantilevered beam; and where the third set of cantilevered beams comprises the third cantilevered beam.

Some such aspects are configured where each cantilevered beam of the first set of cantilevered beams are coupled in parallel to generate a single ended output signal at the transducer connection point of the first cantilevered beam.

Some such aspects are configured where a first half of the first set of cantilevered beams are coupled in parallel with a first polarity and a second half of the first set of cantilevered beams are coupled in parallel with an opposite polarity generate a differential output signal at the transducer connection point of the first cantilevered beam.

Some such aspects further include a plurality of intermediate cantilevered beams each comprising a corresponding transducer connection point and a corresponding reference voltage connection point; where the switching circuitry is further configured to connect each cantilevered beam of the plurality of intermediate cantilevered beams, the first cantilevered beam, and the second cantilevered beam in series between the reference node and the receive signal path node in the first configuration and in parallel between the reference node and the transmit signal path node in the second configuration.

Some such aspects are configured where the plurality of intermediate cantilevered beams includes six cantilevered beams.

Some such aspects are configured where the plurality of intermediate cantilevered beams includes fourteen cantilevered beams configured in a first piezoelectric micromachined ultrasonic transducer (PMUT) and a second PMUT, where the first PMUT comprises eight cantilevered beams including the first cantilevered beam, and where and the second PMUT comprises eight cantilevered beams including the second cantilevered beam. Some such aspects are configured where the eight cantilevered beams of the first PMUT are positioned such that the eight cantilevered beams of the first PMUT and associated gaps between adjacent cantilevered beams of the eight cantilevered beams enclose a symmetrical polygonal shape.

Some such aspects are configured where a shared parallel capacitance of the first cantilevered beam, the second cantilevered beam, and the plurality of intermediate cantilevered beams is greater than 0.5 picofarads in the second configuration.

Some such aspects further include receive circuitry coupled to the receive signal path node; where an input capacitance of the receive circuitry has a value that is less than 10% of a value of a shared parallel capacitance of the first cantilevered beam, the second cantilevered beam, and the plurality of intermediate cantilevered beams in the second configuration.

Some such aspects are configured where the first cantilevered beam and the second cantilevered beam each comprise a top surface having a triangular shape.

Some such aspects further include control circuitry coupled to the switching circuitry to select between connecting a first input or a second input of each switch of the switching circuitry and an output of each switch based on a device operating mode.

Some such aspects are configured where the device operating mode associated with the first configuration is a transmit mode, and where the device operating mode associated with the second configuration is a receive mode.

Some such aspects further include a microelectromechanical (MEMS) chip; and an application specific integrated circuit (ASIC); where the MEMS chip comprises the first electrode layer and the second electrode layer; and where the ASIC comprises the switching circuitry, where the MEMS chip and the ASIC are electrically coupled via wire bonds.

Some such aspects are configured where the MEMS chip comprises a plurality of cantilevered piezoelectric beams each having a rectangular shape; and where the first electrode layer and the second electrode layer are positioned together with the first piezoelectric layer and the second piezoelectric layer in a single cantilevered beam of the plurality of cantilevered piezoelectric beams.

Another aspect is a device. The device comprises an application specific integrated circuit (ASIC) comprising: a signal transmit input; a signal receive output; and routing circuitry; and a microelectromechanical (MEMS) chip comprising: a first cantilevered beam having a transducer connection point and a reference voltage connection point; and a second cantilevered beam having a transducer connection point and a reference voltage connection point; where the routing circuitry is configurable to couple the first cantilevered beam and the second cantilevered beam in series between a reference voltage and the signal receive output in a first configuration and to couple the first cantilevered beam and the second cantilevered beam in parallel between the reference voltage and the signal transmit input in a second configuration.

Some such aspects are configured where the routing circuitry comprises: a first switch having a first input node, a second input node, and a output node, where the first input node is coupled to the signal transmit input, and where the output node is coupled to the transducer connection point of the first cantilevered beam; a second switch having a first input node, a second input node, and a output node, where the first input node is coupled to the reference voltage connection point, and where the second input node is coupled to the second input node of the first switch; and a third switch having a first input node, a second input node, and a output node, where the first input node is coupled to the signal transmit input, where the second input node is coupled to the signal receive output, and where the output node is coupled to the transducer connection point of the second cantilevered beam.

Some such aspects further include a third cantilevered beam having a transducer connection point and a reference voltage connection point.

Some such aspects are configured where the routing circuitry comprises: a first switch having a first input node, a second input node, and a output node, where the first input node is coupled to the signal transmit input, and where the output node is coupled to the transducer connection point of the first cantilevered beam; a second switch having a first input node, a second input node, and a output node, where the first input node is coupled to the reference voltage connection point, where the second input node is coupled to the second input node of the first switch, and where the output node is coupled to the reference voltage connection point of the second switch; a third switch having a first input node, a second input node, and a output node, where the first input node is coupled to the signal transmit input, and where the output node is coupled to the transducer connection point of the second cantilevered beam; a fourth switch having a first input node, a second input node, and a output node, where the first input node is coupled to the reference voltage connection point, and where the second input node is coupled to the second input node of the second switch, and where the output node is coupled to the reference voltage connection point of the third switch; and a fifth switch having a first input node, a second input node, and a output node, where the first input node is coupled to the signal transmit input, where the second input node is coupled to the signal receive output, and where the output node is coupled to the transducer connection point of the third cantilevered beam.

Some such aspects further include a plurality of intermediate cantilevered beams each comprising a corresponding transducer connection point and a corresponding reference voltage connection point; where the routing circuitry is further configured to connect each cantilevered beam of the plurality of intermediate cantilevered beams, the first cantilevered beam, and the second cantilevered beam in series between the reference voltage connection point and the signal receive output in the first configuration and in parallel between the reference voltage connection point and the signal transmit input in the second configuration.

Some such aspects are configured where the plurality of intermediate cantilevered beams includes two cantilevered beams.

Some such aspects are configured where the first configuration is associated with a transmit operating mode, and where the second configuration is associated with a receive operating mode.

Some such aspects further include control circuitry; transmit circuitry comprising a power amplifier coupled between the control circuitry and the signal transmit input; and receive circuitry coupled between the control circuitry and the signal receive output.

Another aspect is a method. The method includes selecting, using control circuitry of a piezoelectric device, a receive mode; configuring, using switching circuitry selected by the control circuitry, a first electrode layer and a second electrode layer of one or more piezoelectric transducers in series between a reference node and a receive signal path node, in response to selection of the receive mode; selecting, using the control circuitry of the piezoelectric device, a transmit mode; and configuring, using the switching circuitry selected by the control circuitry, the first electrode layer and the second electrode layer of one or more piezoelectric transducers in parallel between a reference node and a transmit signal path node, in response to selection of the transmit mode.

The foregoing, together with other features and embodiments, will become more apparent upon referring to the following specification, claims, and accompanying drawings.

BRIEF DESCRIPTION OF DRAWINGS

Like reference symbols in the various drawings indicate like elements.

DETAILED DESCRIPTION

Figure 1A:
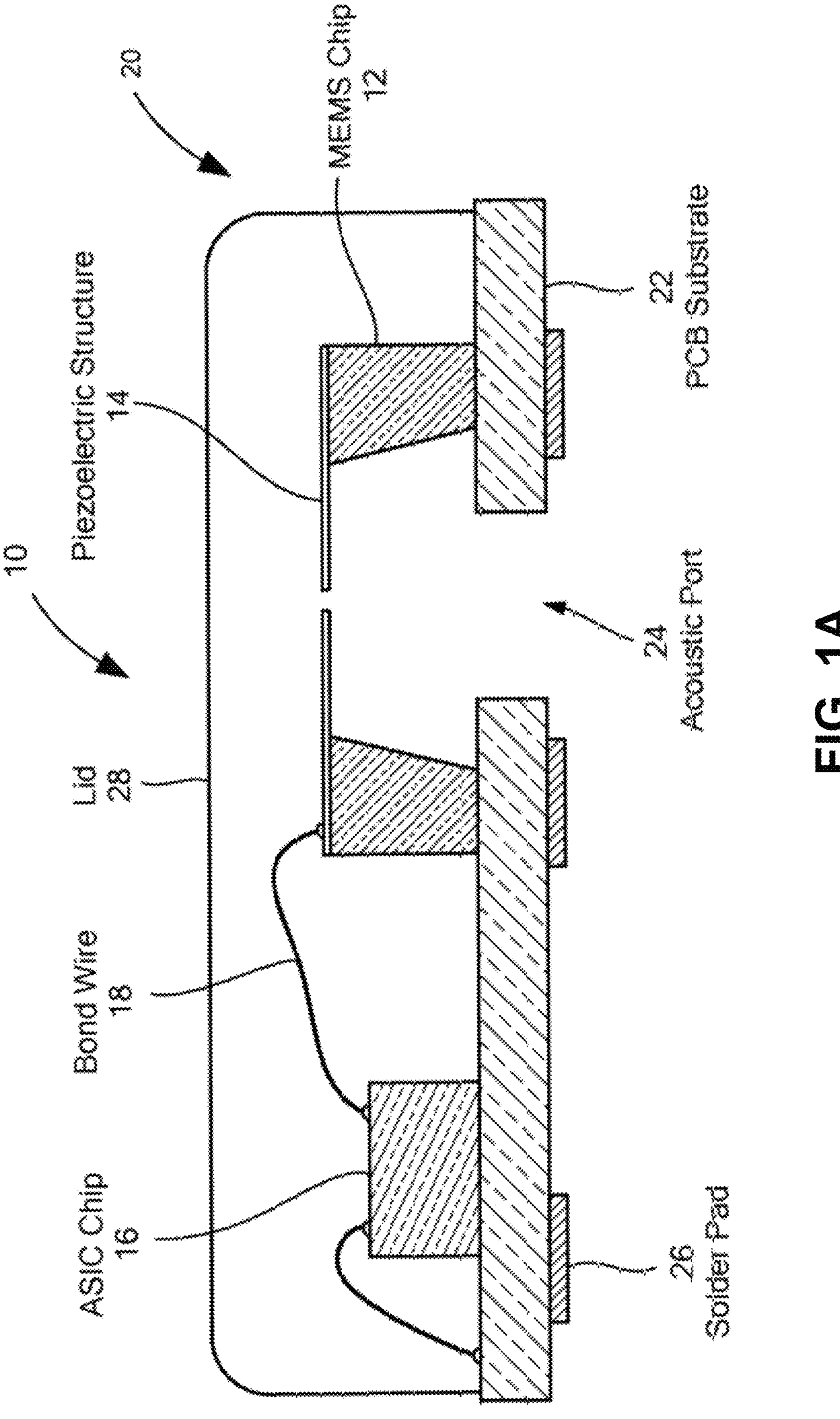
FIG. 1A illustrates an example of an acoustic transducer in accordance with aspects described herein.

The detailed description set forth below in connection with the appended drawings is intended as a description of example aspects and implementations and is not intended to represent the only implementations in which the invention may be practiced. The detailed description includes specific details for the purpose of providing a thorough understanding of the example aspects and implementations. In some instances, some devices are shown in block diagram form. Drawing elements that are common among the following figures may be identified using the same reference numerals.

Aspects described herein include piezoelectric microelectromechanical systems (MEMS) configured as acoustic transducers. In some aspects, the acoustic transducers are specifically configured as high frequency acoustic transducer performance as piezoelectric micromachined ultrasonic transducers (PMUTs). Such transducers convert acoustic energy into electrical signals. As described herein, acoustic waves are longitudinal waves associated with fluctuations in the pressure field of a medium such as air. Ultrasonic waves are acoustic waves at a frequency above human hearing. Ultrasonic transducers can be configured for such frequencies above the audible range of the human ear (e.g., above approximately 20 kilohertz (kHz)). While lower frequency MEMS acoustic transducers can be used as microphones and speakers, PMUTs as described herein operating above 20 kHz can be used for applications such as fingerprint sensing, general touch sensing, gesture recognition, and the like. For example, a PMUT device can be used to implement acoustic location applications for gesture recognition. As part of such operations, a PMUT can be used for transmitting directional ultrasonic signals, and receiving reflected ultrasonic waves, with associated circuitry implementing time-of-flight calculations to identify object positions for gesture recognition.

Such PMUTs can be implemented with a piezoelectric MEMS system using a MEMS acoustic transducer to convert sonic (e.g., air) pressure into an electrical voltage. MEMS acoustic transducers as described herein can be made up of cantilevered beams disposed over an air pocket and largely enclosing the air pocket so that an outside space and the air pocket are separated by the beams of the MEMS acoustic transducer. The air pressure differences between the air in the pocket and the air on the other side of the beams from the pocket (e.g., an outside area where an audio source creates air vibrations or sound) cause electrical signals in the piezoelectric MEMS transducer as the cantilevered beams are deflected based on the changes in air pressure in receive operations. In transmit operations, an applied electrical signal can deflect a MEMS beam at a selected frequency (e.g., an ultrasonic frequency between approximately 20 kHz and 100 kHz) to generate an ultrasonic signal. As detailed below, the dimensions of piezoelectric elements (e.g., cantilevered beams and electrode layers within the cantilevered beams) are configured so that a main mechanical resonance of an acoustic transducer or elements of the transducer are targeted to specific frequencies. In various aspects described herein, acoustic transducers can be designed as a PMUT for operation and mechanical resonance at ultrasound frequencies. In other aspects, any acoustic frequency can be used in accordance with aspects described herein.

Some PMUT implementations suffer from low transmit levels and poor receive sensitivity. Transmit performance can be quantified as proportional to volume displacement associated with cantilever beam movement in units of meters per volt (m/V). Receive sensitivity can be quantified as the voltage generated for a given air pressure as volts per pascal (V/Pa) (e.g., where one pascal is one newton per square meter). Aspects described herein include PMUT cantilevered beams with improved transmit and receive characteristics using MEMS beams in a stack with two piezoelectric layers sandwiched between three electrode layers, and a polysilicon layer used to improve (e.g. decrease variability associated with) beam fabrication tolerances. As described herein, the electrode layers are conductor layers that allow a voltage generated by deflection of the piezoelectric layers to be connected out of a cantilevered beam as part of a circuit system.

Additionally, some aspects described herein include transducer configurations with multiple sections or groupings of conductor/piezoelectric/conductor material stacks in different beams. Connections to supporting transducer circuitry can be configured differently depending on whether a PMUT transducer is in a transmit (e.g., generating ultrasonic waves) or receive (e.g., detecting ultrasonic waves) operating mode.

FIG. 1A illustrates an example of an acoustic transducer in accordance with aspects described herein. FIG. 1A schematically shows a cross-sectional view of an acoustic sensor 10 which may be implemented as a PMUT (e.g., a high frequency MEMS acoustic transducer). As shown, the acoustic sensor 10 of FIG. 1A includes a MEMS chip 12 which can include a die having piezoelectric structures 14, (e.g. cantilevers or diaphragms, to convert sound pressure into electrical signals), and an application-specific integrated circuit chip 16 to buffer and amplify the electrical signal generated by the MEMS chip 12. The MEMS chip 12 and ASIC chip 16 are electrically connected by wire bonding 18, and mounted within the interior chamber of a package (although other packaging and connection techniques are possible). The package has a lid 28 and a substrate 22 (e.g., a printed circuit board). The lid 28 and the substrate 22 act as a package surrounding the cantilevered beams of the MEMS chip 12, along with the additional elements of the acoustic sensor 10. The PCB Substrate 22 and the MEMS substrate of the MEMS chip 12 form an acoustic port 24 for enabling sound pressure to access the piezoelectric structure (s) 14 of the MEMS chip 12 Multiple solder pads 26 are disposed on a bottom surface of the PCB substrate 22 for solder connections of the acoustic sensor 10 as an element of additional devices. The MEMS transducer can, for example, be used as a microphone or other sensor (e.g., high frequency MEMS acoustic sensor for touch and gesture applications) in cell phones, laptop computers, portable microphones, smart home accessories, or any other such devices. A lid 28 can be used to form the housing of the MEMS chip 12, to provide an air pocket which provides one side of the air pressure differentiation that causes deflection and signal generation in the MEMS chip 12, and to mitigate electromagnetic interference (EMI). As indicated above, in some aspects, an acoustic sensor 10 can be implemented without the acoustic port 24 to implement an accelerometer, where the piezoelectric structure 14 will generate an electrical signal based on motion of the acoustic sensor 10, rather than based on an incident acoustic (e.g., ultrasonic) signal from the acoustic port 24.

In the illustrated example of FIG. 1A, the acoustic port 24 is through a gap, hole, or etched via in the PCB substrate 22 aligned with the cantilevered beams of the piezoelectric structure 14. In other examples, the acoustic port 24 can be provided by a hole or other gap in the lid 28, with the acoustic port 24 hole aligned from the top side or any other side with the transduction elements of the piezoelectric structure 14.

FIG. 1A illustrates a structure with the MEMS chip 12 having an acoustic port 24 formed in the MEMS substrate. In other implementations, the MEMS substrate can be closed, with a pocket similar to the pocket formed by a cavity below the piezoelectric structures 14 and the acoustic port 24 on the opposite side of the piezoelectric structure(s) 14 from the substrate 22. In other implementations, other such configurations of the acoustic port 24 can be used so long as a path for acoustic pressure to reach the piezoelectric structures 14 is present.

Additionally, rather than implement the system with two separate chips, some embodiments may implement both the MEMS chip 12 and ASIC 16 as part of the same die. Accordingly, discussion of separate chips is for illustrative purposes. In addition, in other embodiments the ASIC 16 may be implemented on a die in a separate package with one or more interconnects electrically coupling the MEMS chip 12 to the ASIC 16. Similarly, the amplifier discussed above and used for feedback transduction in a feedback transduction loop can, in some aspects, be implemented on an ASIC 16 separate from the MEMS chip 12. In other aspects, the amplifier can be implemented as part of a combined IC with both MEMS and ASIC components of the MEMS chip 12 and the ASIC 16.

Figure 1B:
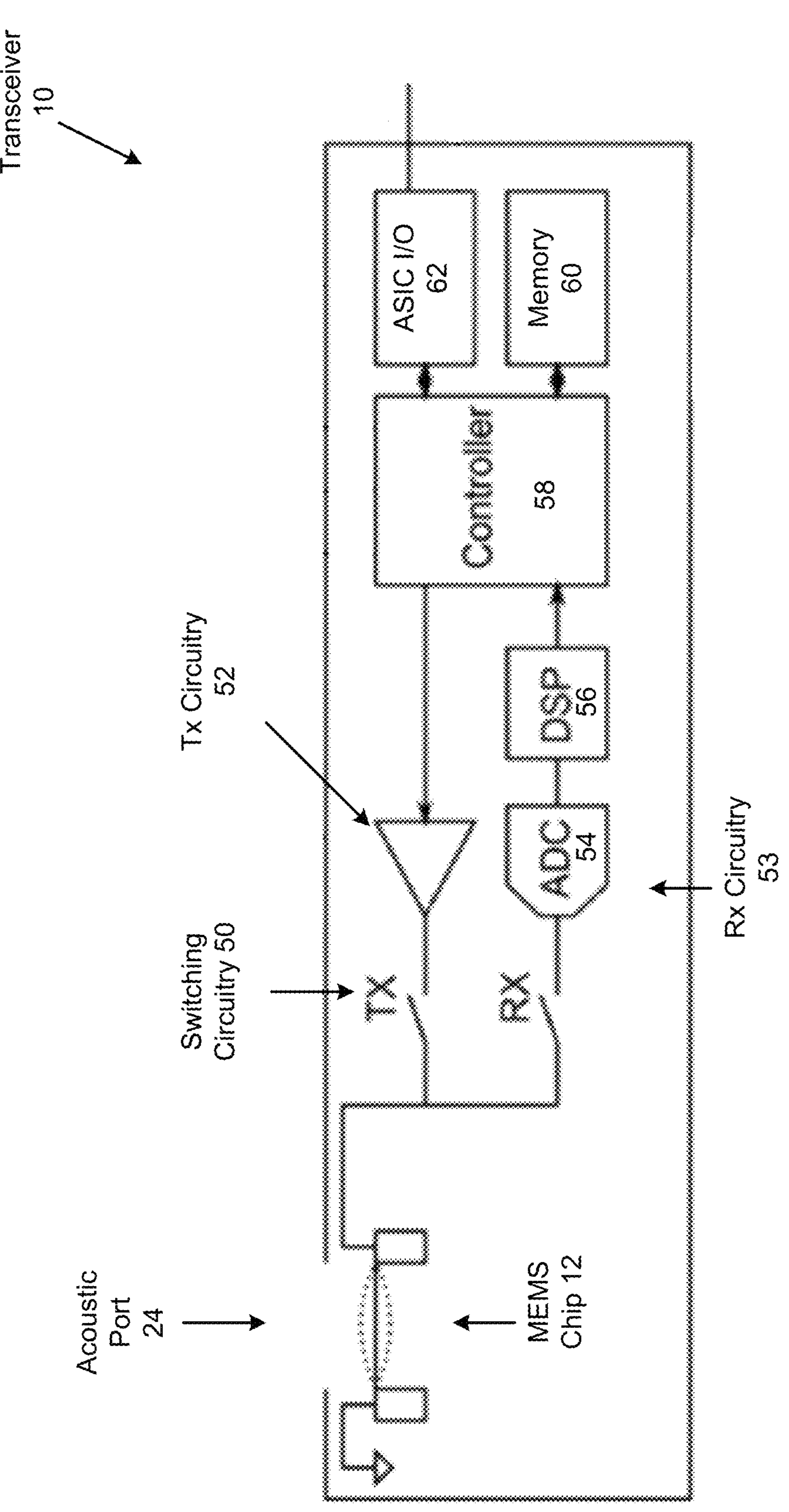
FIG. 1B illustrates circuitry for a piezoelectric micromachined ultrasonic transducers (PMUT) device in accordance with aspects described herein.

FIG. 1B illustrates additional detail of a PMUT transceiver 10 in accordance with aspects described herein. As illustrated, a transceiver can include a MEMS chip 12 having an acoustic port 24 that allows acoustic (e.g., ultrasonic) waves to be transmitted out from the MEMS chip 12 in a transmit mode, or to be sensed in a receive mode. Switching circuitry 50 allows controller 58 to select between receive (Rx) and transmit (Tx) operation. In a Tx mode, an electrical signal associated with an ultrasonic wave to be generated by the MEMS chip 12 is received as an input at the ASIC input/output (I/O) 62, and passed to controller 58. The signal (e.g., as modified by the controller 58 to shape this signal for the MEMS chip 12) may be stored in memory 60 for later use, or passed to Tx circuitry 52 for transmission. The Tx circuitry 52, as part of transmission operations, can perform additional waveform conditioning and amplification (e.g., using a power amplifier), before the Tx electrical signal is sent to the MEMS chip 12 to be converted to acoustic signals. The Tx Circuitry 52 therefore drives the MEMS chip 12 with a signal that causes the MEMS chip 12 to generate acoustic signals that pass through the acoustic port 24.

In a receive mode, the MEMS chip 12 receives incident acoustic waves via the acoustic port 12, which are converted to electrical signals (e.g., by cantilevered beams of the acoustic transducer of the MEMS chip 12). ADC 54 and DSP 56 are part of receive (Rx) circuitry 53 that process received signals from the MEMS chip 12. The Rx circuitry 53 including ADC 54 and DSP 56 convert the analog electrical signal from the MEMS chip 12 to a format acceptable to the controller 58, which can either store the signal in memory 60 or transmit the signal to additional processing circuitry of a larger device via the ASIC I/O 62.

Figure 2:
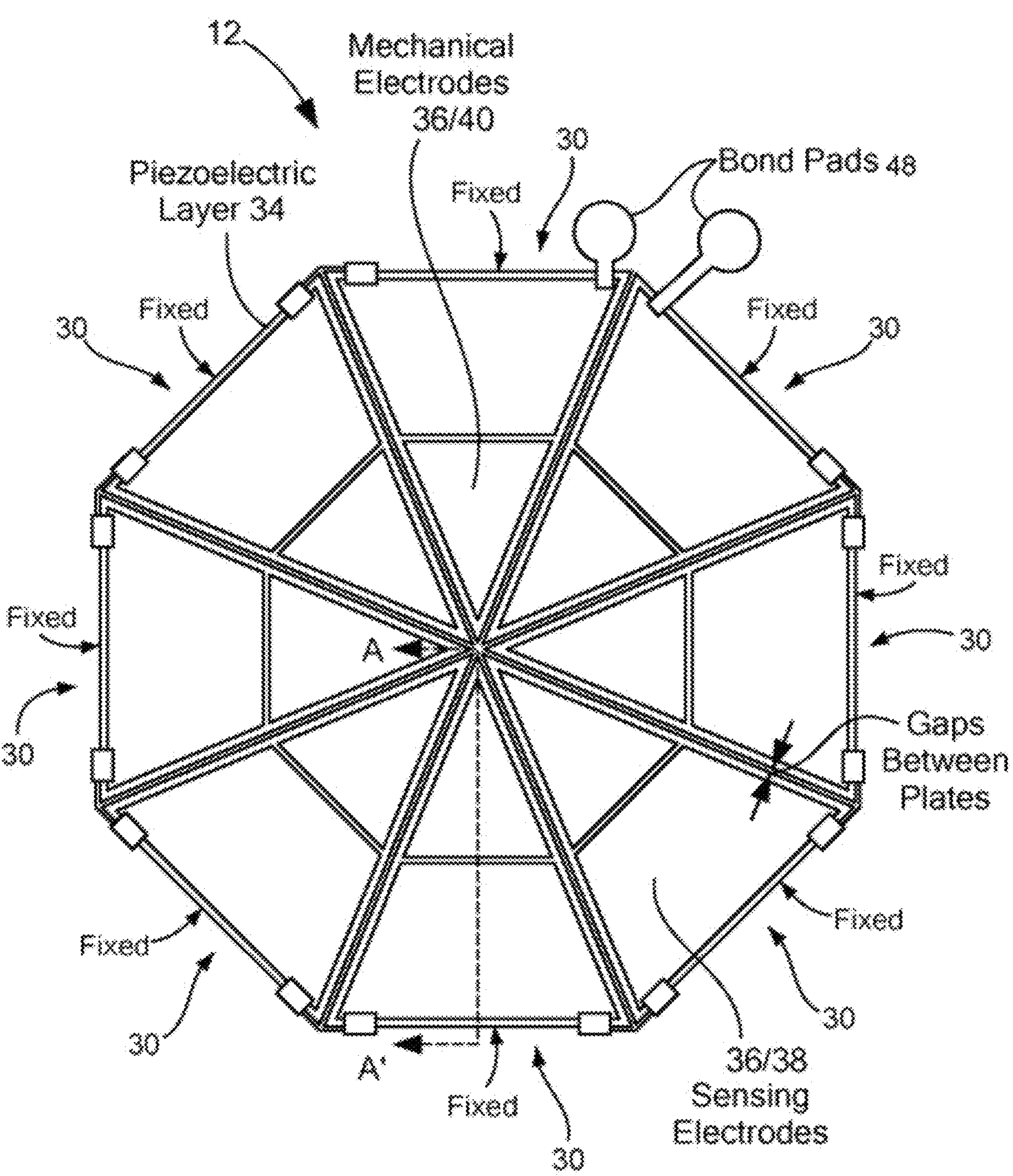
FIG. 2 illustrates a plan view of a transducer that may be used in accordance with aspects described herein.

FIG. 2 illustrates a plan view of a transducer that may be used in accordance with aspects described herein. FIG. 2 schematically shows a plan view of a piezoelectric MEMS acoustic transducer of a MEMS chip 12 using eight MEMS cantilevers (e.g., also known as "sense arms", "sense members", "beams", or "cantilevered beams") formed as piezoelectric triangular cantilevers 30. These members together form an octagonal MEMS acoustic sensor that can be used to implement an acoustic transducer such as a PMUT.

Each cantilever 30 has a piezoelectric structure formed in a piezoelectric layer 34, with the structure of each of the eight cantilevers 30 having an associated fixed end and an associated central end. The central end of each cantilever 30 in FIG. 2 meet near a center, with edges of each cantilever 30 separated from adjacent cantilever by baps between the cantilevers 30, as illustrated. During operation, the fixed ends remain stationary, and pressure from acoustic signals (e.g., from the acoustic port 24) incident on the cantilevers 30 causes a pressure differential, which causes the cantilevers 30 to deflect in and out (e.g., via a slight rotation around the fixed end). The deflection causes an electrical signal from the sensing electrodes 36/38 which creates the electrical signal that can be amplified by an analog front end and passed to processing circuitry as an audio signal. The mechanical electrodes 36/40 provide mechanical structure in the central end of each cantilever 30 of the.

In an one example implementation, the immobile portion of the fixed end is approximately 10 micrometers (um) of a 144 um long beam with two 500 nm Aluminum Nitride piezoelectric layers 34, with the remaining portion of the fixed end bending (e.g., deflecting) along with the free end based on acoustic pressures applied across the cantilevers 30. In another aspect, the length can be approximately 114 um with two 400 nm Aluminum Scandium Nitride ($AlSc_{40}N$) piezoelectric layers 34. In other aspects, other lengths or stack configurations can be used. The eight cantilevers 30 each have a similar triangle shape, with the triangle bases fixed to a substrate (e.g., a substrate of the MEMS chip 12, not shown in FIG. 2) at the extreme end of the fixed end of each cantilever 30. Each cantilever 30 is positioned with sides adjacent to sides of another of the cantilevered beams separated by the gap between the cantilevers. The position of the eight cantilevers 30 with the gaps creates a symmetrical polygon shape bounded by the fixed bases around the outside of the symmetrical polygon (e.g., an octagon, with one exterior side for each of the cantilever 30). In other aspects, other shapes can be used. In other implementations, MEMS acoustic transducers can include cantilevered beams with different beam shapes for the same transducer, so long as the fixed exterior edges attached to the substrate form an enclosed transducer that separates air on one side (e.g., a pocket side) from air on another side (e.g., an acoustic port side similar to the acoustic port 24) using the cantilevered beams (e.g., the cantilevers 30) and gaps between the beams. The separation allows the pressure difference between the sides of the MEMS transducer to apply force to the beams and generate a signal that can be communicated to an analog front end (e.g., an amplifier that can be used, for example, in Rx circuitry 650 of FIGS. 6A and 6B.) and then to additional processing circuitry via the bond pads 48. Similarly, an electrical signal provided from transmit circuitry (e.g., such as Tx circuitry 610 of FIGS. 6A and 6B) can cause the cantilevers 30 to deflect, generating an acoustic signal.

As illustrated in FIG. 2, the cantilevers 30 have an associated length, determined by the line segment from the tip of the central end that is perpendicular to the fixed extreme end of the fixed end. The line segment extends from the fixed end at the substrate to the tip of the central end. As described above, when sound vibrations are present at a surface of the deflection beams, the cantilevered beams will move due to the pressure (e.g., z direction movement in and out of the x-y plane illustrated in FIG. 2). The movement in and out of this plane is referred to herein as vertical deflection. The deflection at the fixed end will be less than the deflection at the central end, with the amount of deflection increasing along the distance of the line segment away from the substrate toward the tip of the central end. The electrodes that generate the electrical signals at the bond pads 48 in response to the acoustic vibrations on the cantilevers 30 can add rigidity to the cantilever 30, and so in some implementations, placement of the sensing electrodes 36/38 can be limited to a space approximately two-thirds of the line segment distance from the fixed attachment to the substrate at the fixed end towards the tip of the central end (e.g., limited to a fixed end). In some implementations, an electrode layer can cover a surface or x-y plane cross section of the entire illustrated fixed end of each of the cantilevered beams. In other implementations, smaller electrode shapes can be used in a portion of the fixed end of each of the cantilevers 30. In some aspects, the central end of each of the cantilevered beams does not include electrode layers. In some aspects, the electrode layers (e.g. conductor layers) do not extend to the tip of the central end (e.g., the free movement end) of each cantilever 30 to avoid sensing free end movement in the deflection end (e.g., where the signal which is proportional to the stress in the cantilever) is lower.

Figure 3:
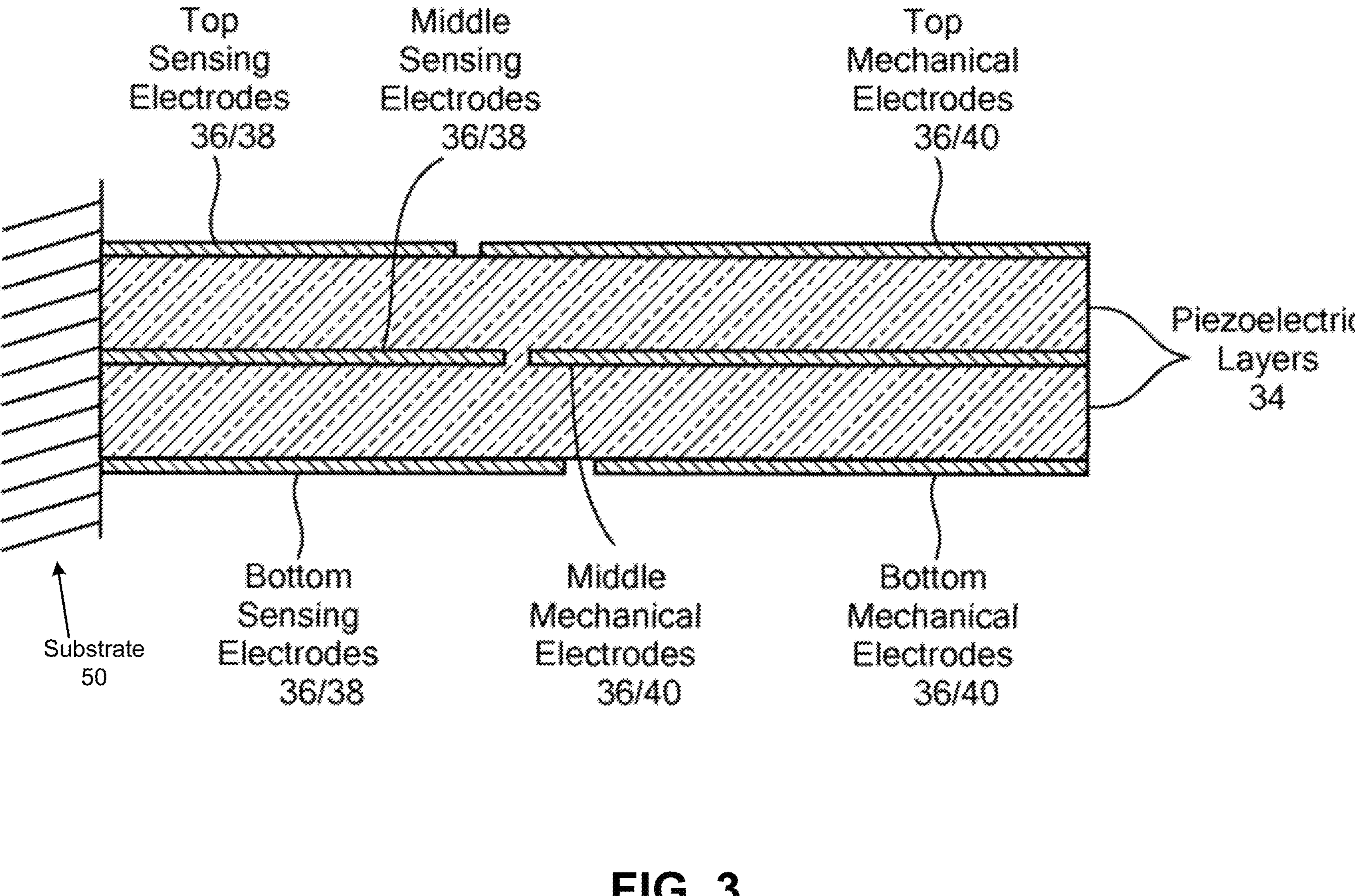
FIG. 3 illustrates a cross-sectional view of one portion of a microelectromechanical (MEMS) beam that can be used to implement a piezoelectric micromachined ultrasonic transducers (PMUT) in accordance with aspects described herein.

FIG. 3 illustrates a cross-sectional view of one portion of the MEMS microphone of FIG. 2 accordance with aspects described herein. FIG. 3 shows an example cross-sectional view of one of those cantilevers 30. Other aspects of a piezoelectric MEMS acoustic transducer may use more or fewer cantilevers 30. Accordingly, as with other features, discussion of eight cantilevers 30 is for illustrative purposes only. These triangular cantilevers 30 are fixed to a substrate 50 (e.g., a silicon substrate) at their respective bases and are configured to freely move in response to incoming/incident sound pressure (i.e., an acoustic wave). The intersection of the substrate 50 and the piezoelectric layers (e.g., as well as the electrodes at the substrate 50) are the fixed end of the cantilever(s) 30. Triangular cantilevers 30 can provide a benefit over rectangular cantilevers as the triangular cantilevers can be more simply configured to form a gap controlling geometry separating an acoustic port (e.g., the acoustic port 24) on one side of the cantilevers of the piezoelectric MEMS acoustic transducer from an air pocket on the other side of the cantilevers. Specifically, when the cantilevers 30 bend up or down due to either sound pressure or residual stress, the gaps between adjacent cantilevers 30 typically remain relatively small and uniform in the example symmetrical shapes with fixed ends using the triangular cantilevers 30. In some aspects, electrode materials can be Mo, Pt, tungsten (W), or Ruthenium (Ru). In some aspects piezoelectric materials would be AlN (or Sc-doped AlN) with thicknesses between 200 nm and 1 um or PZT with similar thickness ranges. The resonance frequency may be as low as 20 kHz. In some aspects, a PMUT in accordance with aspects described can operate from 40 kHz to 200 kHz. This range in resonance frequency and the materials used in the stack determine the length of a transceiver element or cantilevered piezoelectric beam in accordance with aspects described herein. In some aspects, shorter beams can be made with softer material having higher resonance frequencies such as AlSc40N at approximately 200 nm, with a 200 kHz resonance giving a length of approximately 75 um. Aspects with longer piezoelectric beams can use stiffer and thicker material with lower resonance frequencies and a deflection beam length of approximately 570 um.

The electrodes 36 are generally identified by reference number 36. However, the electrodes used to sense signal are referred to as "sensing electrodes" and are identified by reference number 38. These electrodes are electrically connected in series to achieve the desired capacitance and sensitivity values. In addition to the sensing electrodes 38, the rest of the cantilever 30 also may be covered by metal to maintain certain mechanical strength of the structure. However, these "mechanical electrodes 40" do not contribute to the electrical signal of the microphone output. As discussed above, some aspects can include cantilevers 30 without mechanical electrodes 40.

As described above, as a cantilever 30 bends or flexes around the fixed end, the sensing electrodes 36/38 generate an electrical signal. The electrical signal from an upward flex (e.g., relative to the illustrated positioning in FIG. 3, will be inverted compared with the signal of a downward flex. In some implementations, the signal from each cantilever 30 of a piezoelectric MEMS acoustic transducer can be connected to the same signal path so that the electrical signals from each cantilever 30 are combined (e.g., a shared bond pads 48). In other aspects, each cantilever 30 may have a separate signal path, allowing the signal from each cantilever 30 to be processed separately. In some aspects, groups of cantilevers 30 can be connected in different combinations. As described below with respect to FIGS. 6A and 6B, in some aspects, switching circuitry or groups of switches can be used to reconfigure the connections between multiple cantilevers 30 to provide different characteristics for different operating modes, such as transmit and receive modes.

In one aspect, adjacent cantilevers 30 can be connected to separate electrical paths, such that every other cantilever 30 has a shared path. The electrical connections in such a configuration can be flipped to create a differential signal. Such an aspect can operate such that when an acoustic signal incident on a piezoelectric MEMS acoustic transducer causes all the cantilevers 30 to flex upward, half of the cantilevers 30 create a positive signal, and half the cantilevers 30 create a negative signal. The two separate signals can then be connected to opposite inverting and non-inverting ends of an amplifier of an analog front end. Similarly, when the same acoustic vibration causes the cantilevers 30 to flex downward, the signals of the two groups will flip polarity, providing for a differential electrical signal from the piezoelectric MEMS acoustic transducer.

Alternatively, rather than alternating cantilevers 30 within a single piezoelectric MEMS transducer to create a differential signal, identical MEMS transducers can be placed across a shared acoustic port (e.g., the acoustic port 24), with the connections to the amplifier of an analog front-end reversed and coupled to different inverting and non-inverting inputs of a differential amplifier of the analog front-end to create the differential signal using multiple piezoelectric MEMS transducers.

The cantilever 30 can be fabricated by one or multiple layers of piezoelectric material sandwiched by top and bottom metal electrodes 36. FIG. 3 schematically shows an example of this structure. The piezoelectric layers 34 can be made by piezoelectric materials used in MEMS devices, such as one or more of aluminum nitride (AlN), aluminum scandium nitride (AlScN), zinc oxide (ZnO), and lead zirconate titanate (PZT). The electrodes 36 can be made by metal materials used in MEMS devices, such as one or more of molybdenum (Mo), platinum (Pi), nickel (Ni) and aluminum (Al). Alternatively, the electrodes 36 can be formed from a non-metal, such as doped polysilicon. These electrodes 36 can cover only a portion of the cantilever 30, e.g., from the base to about one third of the cantilever 30, as these areas generate electrical energy more efficiently within the piezoelectric layer 34 than the areas near the central end (e.g., the free movement end) of each cantilever 30. Specifically, high stress concentration in these areas near the base induced by the incoming sound pressure is converted into electrical signal by direct piezoelectric effect.

Figure 4:
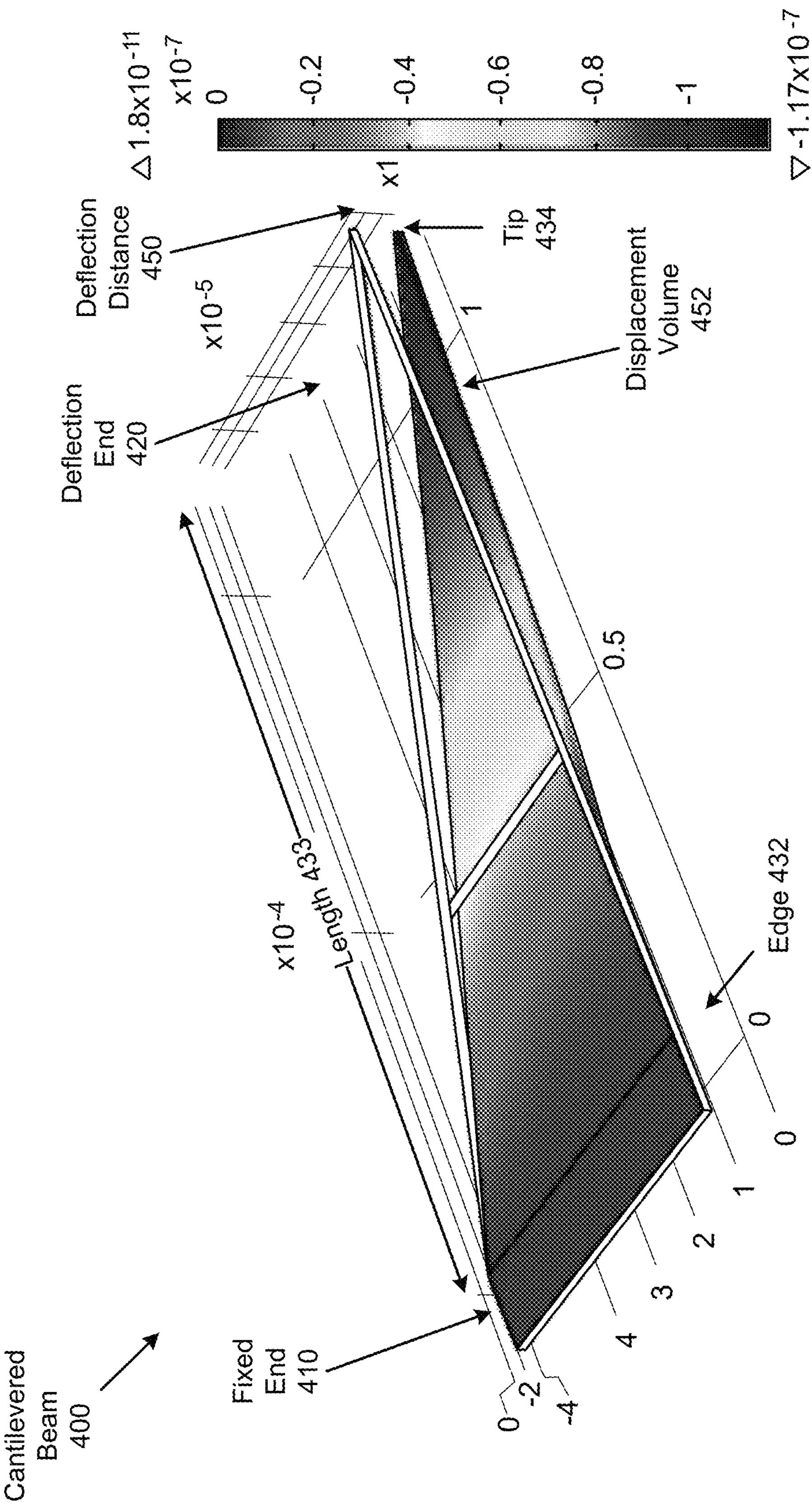
FIG. 4 illustrates aspects of a MEMS beam that can be used to implement an acoustic resonator in accordance with aspects described herein.

FIG. 4 illustrates aspects of a cantilevered beam 400 that can be used to implement an acoustic transducer such as a PMUT in accordance with aspects described herein. Some acoustic transducers can be configured with 75 degree slots around an enclosed shape with 15 degree positions fixed (e.g., with 4 slots to enclose a circle or polygon). Some such acoustic transducers can use 4.5 um thick polysilicon, a 1.5 um AlN piezoelectric layer, with 200 nm thick Mo electrodes, and a beam length (e.g., radius) of approximately 300 um. Such a device can operate with a resonance frequency of approximately 200-220 kHz, with an average displacement of $2.83e^{-7}$ square meters ($m^2$) and 78 picometers per volt (pm/V). Such configurations can provide consistent resonance frequency, but with relatively poor transmit levels and receive sensitivity.

FIG. 4 shows half of the cantilevered beam that may provide improved transmit levels and receive sensitivity for example for a PMUT implementation, with the second half (not shown) symmetrical around the lower edge of the illustrated portion. Such a cantilevered beam 400 can be combined with additional cantilevered beams as shown in FIG. 2 to create a transducer having eight triangular cantilevered beams having tips meeting in a center of an enclosed geometry (e.g., enclosed by the fixed ends 410 of each of the beams). In other examples, rectangular configurations or other configurations of a beam can be used, particularly where low frequencies will not impact signals (e.g., and adjacent spaces between beams as illustrated in FIG. 2 have limited performance impact). When compared with other cantilevered beams described above, the PMUT cantilevered beam 400 includes a narrower width at the fixed end 410 beam with a fixed section extending to edge 432 (e.g., discussed below with respect to FIG. 5). A deflection end 420 of the cantilevered beam 400 extends from the edge 432 to the tip 434 of the deflection end. The deflection distance 450 is the distance the tip 434 travels during transmit or receive operations, and the displacement volume 452 is the volume calculated as the integral of the displacement over the diaphragm or beam area.

In one aspect, the cantilevered beam 400 has a stack with two 500 nm thick AlN piezoelectric layers and three 20 nm Mo conductive electrodes, a length 433 of approximately 144 μm, and a target resonance frequency of approximately 160 kHz (e.g., with approximate values being within a manufacturing threshold tolerance of the target value). Such an implementation of the cantilevered beam 400 can achieve transmit characteristics where an average for the deflection distance over the diaphragm or beam area for a given applied voltage (e.g., from a transmit signal) is 12.6 nm/V, an average displacement volume 452 for an applied voltage is $3.47e^{-15}$ $mm^3$/V. Similar receive operation characteristics can be 130 uV/Pa (e.g., voltage generated for a given acoustic pressure incident on the cantilevered beam 400) with an active capacitance value (e.g., an electrical characteristic for a beam within supporting circuitry) of 17.7 picofarads. While these numbers describe an example implementation in accordance with certain aspects, other configurations are possible based on a target application, with piezoelectric cantilevered beam dimensions and system structures and groupings adjusted for particular performance targets.

Such a beam integrated into a PMUT design can provide an increase in transmit and receive performance compared with other PMUT designs (e.g., transmit improvements of approximately 12 decibels (dB) and receive sensitivity increased by approximately 6 dB for a given resonance frequency).

In another aspect, the cantilevered beam 400 has a stack with two 400 nm thick $AlSc_{40}N$ piezoelectric layers and three conductive electrodes, with the length 433 approximately 114 μm, and a target resonance frequency of approximately 160 kHz (e.g., with approximate values being within a manufacturing threshold tolerance of the target value). Such an implementation of the cantilevered beam 400 can achieve transmit characteristics where an average for the deflection distance 450 for a given applied voltage (e.g., from a transmit signal) is 39.6 nm/V, an average displacement volume 452 for an applied voltage is $7.25e^{-15}$ $mm^3$/V. Similar receive operation characteristics can be 187 uV/Pa (e.g., voltage generated for a given acoustic pressure incident on the cantilevered beam 400) with an active capacitance value (e.g., an electrical characteristic for a beam within supporting circuitry) of 31.8 picofarads. Such an implementation can achieve a resonance frequency similar to the first aspect described above, but with a smaller size.

Figure 5A:
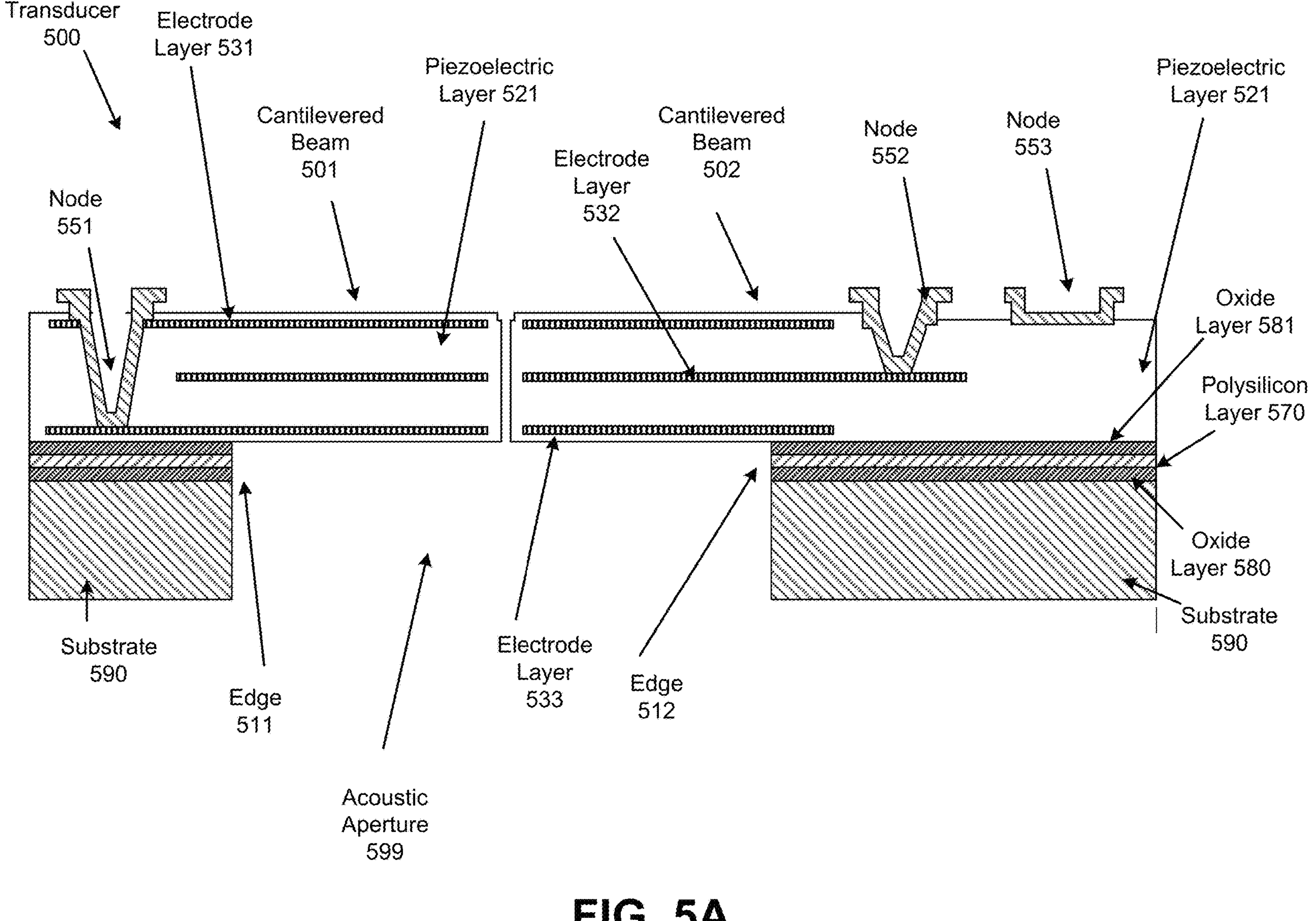
FIG. 5A illustrates aspects of a MEMS beam that can be used to implement an acoustic resonator in accordance with aspects described herein.

FIG. 5A illustrates aspects of an acoustic transducer 500 showing a cross section with two cantilevered beams 501 and 502 that can be used to implement a PMUT or other acoustic sensor in accordance with aspects described herein.

The transducer 500 includes a cantilevered beam 501 and a cantilevered beam 502. The cantilevered beams 501, 502 can be beams as described above. In one implementation, cantilevered beams 501, 502 have a top surface (not shown) that is triangular, similar to the cantilevered beams of FIG. 2. In other aspects, the cantilevered beams can have a top surface with a rectangular shape. In some aspects, particularly for ultrasonic applications above 20 kHz where the cantilevered beams are used for a PMUT, and low frequency drift and pressure variations across a cantilevered beam are not a concern for the application, rectangular beams can be used in place of triangular or pie shaped beams that enclose a membrane area.

Each cantilevered beam 501, 502 includes one or more electrode layers (e.g., conductor layers), shown as electrode layers 531, 532, 533. The conductive electrode layers are positioned around a piezoelectric material formed in piezoelectric layer 521. Each electrode layer is coupled to a conductive node. As illustrated, electrode layer 531 and electrode layer 533 of cantilevered beam 501 are coupled to the node 551, and electrode layer 532 of the cantilevered beam 502 is coupled to the node 552. As the PMUT cantilevered beams deflect, voltages are created at the electrode layers that correspond to an amount of deflection. In the illustrated transducer 500 of FIG. 5A, the further up or down the beams deflect, the greater the magnitude of the generated voltage. The nodes 551, 552 coupled to the electrode layers 531, 532, 533 allow the generated voltage to be transmitted to additional circuitry. Nodes 551, 552, and 553 are electrical contacts to various layers. Node 553 represents a bond pad and can be connected to the rest of the device by metal traces. In some aspects, each cantilevered beam as illustrated with three electrode layers two nodes, one connecting to top and bottom conductive layers and the other node connecting to the middle electrode (e.g., conductive) layer.

Separate electrode layers can generate separate voltages from contact with the same piezoelectric layer. For example, adjacent non-touching electrode layers, such as the electrode layer 532 and 533 of the cantilevered beam 501, can generate separate signals when part of piezoelectric stacks with a shared piezoelectric layer. For example, in FIG. 2, each cantilever 30 can have a single shared piezoelectric layer, but multiple different electrode layers configured in any geometry as long as the electrode layers are not touching (e.g., are separated by the piezoelectric layer and insulating material or air. Thus, a single cantilevered beam can create independent signals that can be treated as separate elements of a circuit or used to generate a differential signal. The separate signals can be in addition to signals generated by separate cantilevered beams. In other aspects, each beam is configured to generate a single output signal via one or more nodes (e.g., the nodes 551 for the cantilevered beam 501, the node 552 and 553 for the cantilevered beam 502, etc.) that can be electrically coupled. In some aspects, multiple beams can be electrically coupled to generate a single output signal. Additional details of various configurations and connections between beams and electrode layers are described below, particularly with respect to FIGS. 6A and 6B.

As described above, each beam can be mounted or otherwise disposed on a substrate. In the aspect illustrated in FIG. 5A, the cantilevered beams 502 and 502 are each physically attached to a substrate 590 at a fixed end. The physical connection of FIG. 5A between the cantilevered beams 501, 502 occurs via an additional stack of a polysilicon layer 570 between two oxide layers 580. The addition of the polysilicon layer assists with limiting variance in the positioning of edge 511. The edge 511 of the support contact of the cantilevered beam 501 is where a deflection end of the cantilevered beam 501 protrudes over an acoustic aperture 599. Similarly, edge 512 separates a fixe end of the cantilevered beam 502 from a deflection end, with the deflection end disposed over the acoustic aperture 599, which allows the deflection end of the cantilevered beam 502 to move without contacting a mass that will interfere with the acoustic transduction. While two beams facing each other (e.g., to form a membrane enclosing opposite top and bottom sides of the transducer 500) are illustrated, in some aspects, either the left or the right sections with one cantilevered beam (e.g., either the cantilevered beam 501 or the cantilevered beam 502) can be used in an open area without an opposite facing beam. In such an example, the acoustic aperture 599 is the area under the deflection end of the beam. In some aspects, the acoustic aperture 599 is part of an acoustic port (e.g., the acoustic port 24) which extends through the substrate 590 and any packaging to an exterior acoustic path. In other aspects, the acoustic aperture 599 may be a space for the deflection end of a cantilevered beam to vibrate, with an acoustic port above the beam (e.g., through a package lid such as the lid 28 aligned with the acoustic aperture, or in another position relative to the beam.)

Figure 5B:
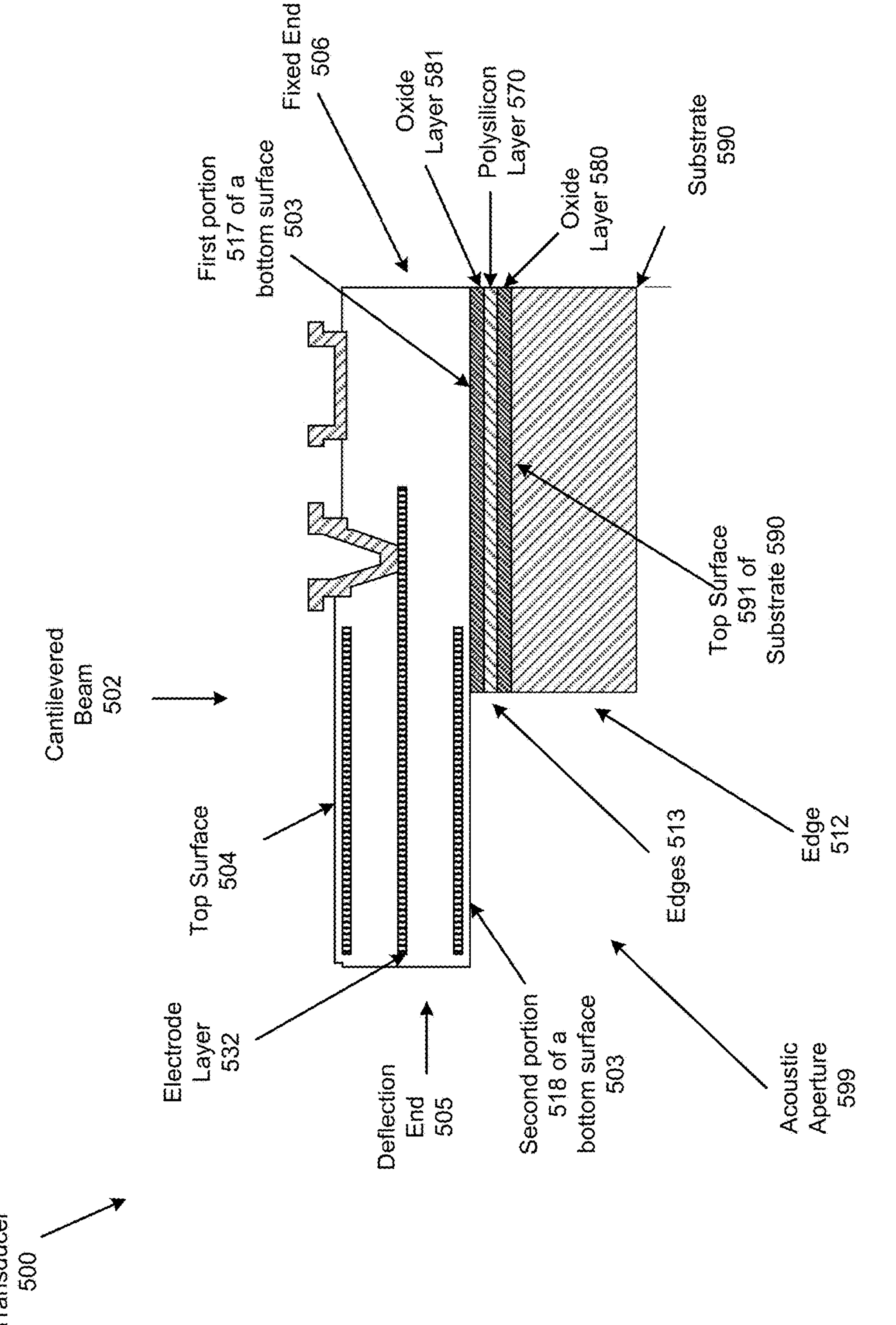
FIG. 5B illustrates aspects of a MEMS beam that can be used to implement an acoustic resonator in accordance with aspects described herein.

FIG. 5B illustrates a portion of the transducer 500 of FIG. 5A, with additional geometry identified. As shown in FIG. 5B, the transducer 500 has the silicon substrate 590 having a top surface 591, wherein the top surface 591 has a first portion 515 (shown in FIG. 5C) and an edge 512 along the first portion 515 associated with the acoustic aperture 599. The first silicon oxide layer 580 is disposed over the first portion 515 of the top surface 591 of the silicon substrate 590. The polysilicon layer 570 is disposed over the first silicon oxide layer 580. The second silicon oxide layer 581 is disposed over the polysilicon layer 570. The cantilevered beam 502 has a fixed end 506, a deflection end 505, a top surface 504, and a bottom surface 503. A first portion 517 of the bottom surface 503 at the fixed end 506 of the cantilevered beam 502 is disposed over the second silicon oxide layer 581. A second portion 518 of the bottom surface 503 at the deflection end 505 is formed over the acoustic aperture 599. As described herein, the oxide layer 581, the polysilicon layer 570, and the oxide layer 580 have edges 513 that can be formed via top side edging as part of the stack of materials to provide less variance in the alignment with the cantilevered beam 502 to provide a consistent length of the deflection end 505 of the cantilevered beam 502, which adjusts the resonance frequency operation of the cantilevered beam 502. As shown, the edge 512 (e.g., formed by back-side etching of the substrate 590) and the edges 513 align along a boundary where the second portion 518 and the first portion 517 of the bottom surface 503 meet (e.g., the point where the edges 513 meet the bottom surface 503 of the cantilevered beam 502, which adjusts the length and resonance frequency of the transducer 500 by setting the length of the deflection end 505 of the cantilevered beam 502).

One aspect in accordance with examples described herein is a PMUT device comprising a cantilevered beam comprising a fixed end, a deflection end, a top surface, and a bottom surface and means for supporting the fixed end of the cantilevered beam having an edge formed by a top-side etch process to provide an accurate length of the deflection end of the cantilevered beam.

Another aspect is a method for fabricating a cantilevered beam having an edge formed by a top-side etch process to provide an accurate length of the deflection end of the cantilevered beam. One such method includes operations for forming a silicon substrate having a top surface and a bottom surface, where the top surface has a first portion and a second portion different from the first portion; forming a first silicon oxide layer disposed over the first portion of the top surface of the silicon substrate; removing the first silicon oxide layer over the second portion of the top surface of the silicon substrate; forming a polysilicon layer disposed over the silicon oxide layer and the second portion of the top surface of the silicon substrate; forming a second silicon oxide layer disposed over the polysilicon layer; forming a cantilevered beam comprising a fixed end, a deflection end, a top surface, and a bottom surface, where a portion of the bottom surface at the fixed end of the cantilevered beam is disposed over the second silicon oxide layer, and where a cantilever gap is formed over the second portion of the silicon substrate between the bottom surface of the cantilevered beam and the top surface of the silicon substrate; and forming an acoustic aperture by removing a portion of the polysilicon layer, a portion of the second silicon oxide layer, and a portion of the silicon substrate aligned with the second portion of the top surface of the silicon substrate.

Figure 5C:
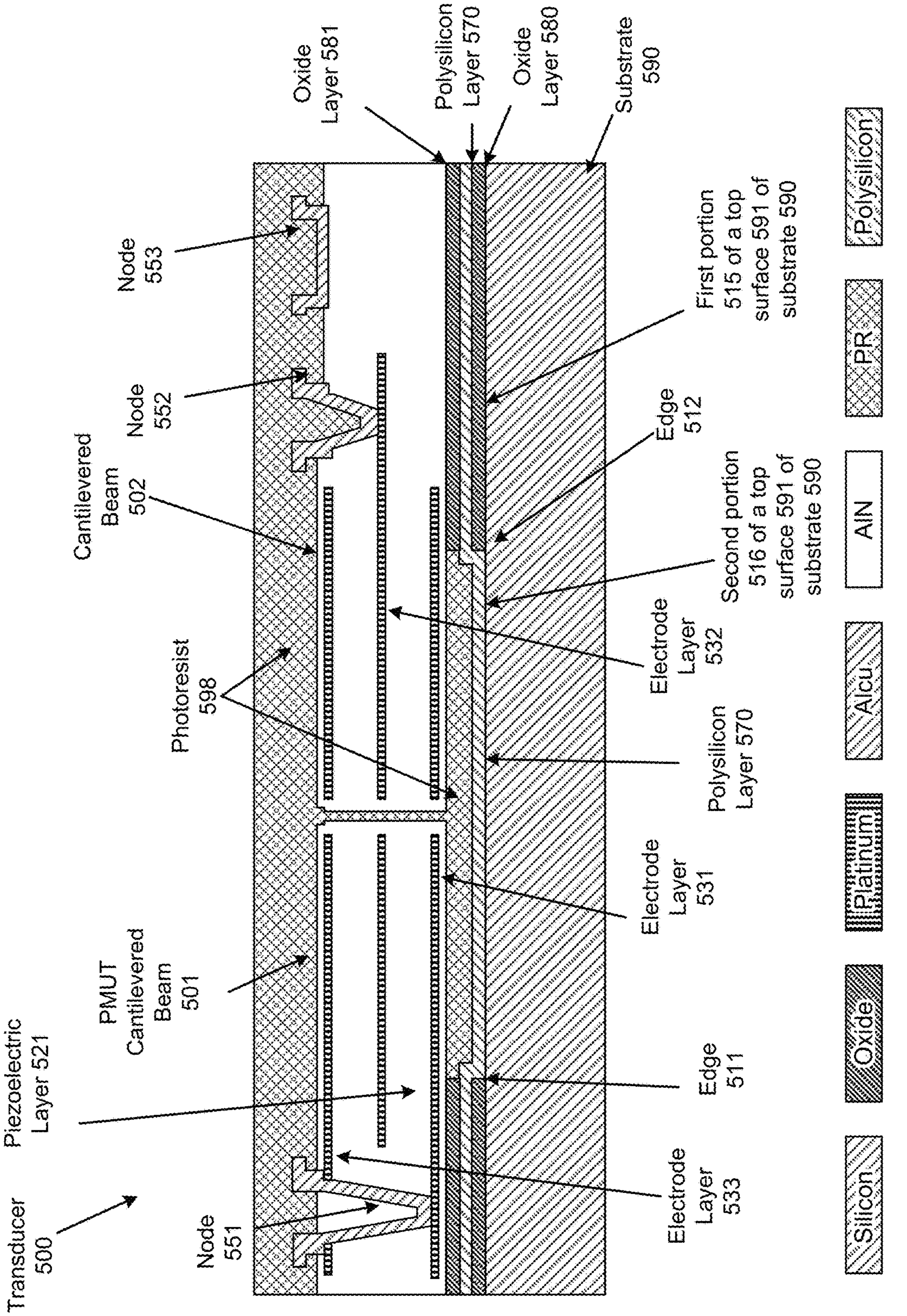
FIG. 5C illustrates aspects of a MEMS beam that can be used to implement an acoustic resonator in accordance with aspects described herein.

FIG. 5C illustrates additional aspects of an acoustic transducer 500 showing a cross section with the two cantilevered beams 501 and 502. FIG. 5C illustrates an intermediate manufacturing step during fabrication of the acoustic transducer 500. The acoustic transducer 500 of FIG. 5C includes the same elements of the acoustic transducer 500 discussed above for FIG. 5A prior to creation of the acoustic port and prior to removal of photoresist 598 used to fabricate the piezoelectric stack of the cantilevered beams 501, 502.

As illustrated, the bottom substrate 590 can be a silicon substrate having a top surface and a bottom surface. An etching pattern can be used to divide the top surface into a first portion 515 and a second portion 516 different from the first portion. The second portion 516 of the top surface 591 of the substrate 590 is the portion between the edge 511 and the edge 512. The first portion 515 is the part of the top surface 591 outside the second portion 516 (e.g., to the left of the edge 511 and to the right of the edge 512). The first oxide layer 580 can be deposited in a uniform layer, with the portion of the first oxide layer 580 over the second portion of the top surface removed (e.g., via a patterned etch or other removal process). The placement of the polysilicon layer 570 after removal results in the step structure shown in FIG. 5C and the step in the polysilicon layer 570 at the edge 511 and the edge 512. A similar etch process can be used to remove a portion of the second oxide layer 581, and the etched gap can be filled with a photoresist material. The piezoelectric stack for the separate cantilevered beams 501, 502 can be built on top of this supporting stack below the bottom surface of the cantilevered beams 501, 502, resulting in the supporting stack of the substrate 590, the oxide layer 580, the polysilicon layer 570, and the second oxide layer 581 supporting a fixed end of each of the cantilevered beams 501, 502. During fabrication, the photoresist 598 can be added in various operations as needed to support the cantilevered beams 501, 502.

Removal operations (e.g., etching, etc.) can then be used to create the acoustic aperture 599 seen in FIG. 5A. Particularly for PMUTs operating at ultrasonic frequencies, resonance frequency consistency is an important device characteristic when using multiple devices in arrays or multiple beams. Variation in the length of the deflection end of a cantilevered beam (e.g., from an edge of support such as the edge 511 and 512 to a corresponding tip) reduces consistency. Aspects describe herein improve device performance with the use of the polysilicon layer 570 between the oxide layers 580 and 581 to reduce variance in the position of the corresponding edges and associated performance variance associated with uncertainty in the deflection beam length. In some aspects, such variance is reduced during manufacturing of the stack that generates the edges 511 and 512 using the patterned oxide under polysilicon, ion beam trimming of AlN, or a combination of both operations to reduce variance in edge position, and associated variances in beam length and resonance frequency. In some aspects, use of a symmetric film stack can further reduce performance variations due to temperature stability associated with the symmetrical film stack structure.

As discussed above, multiple etch and removal operations are used. The acoustic aperture 599 is primarily generated by a back-side pattern and etch. A top-side pattern and etch is used to remove the portion of the first oxide layer 580 on the second portion 516 of the substrate 590 (e.g., prior to the piezoelectric stacks of the cantilevered beams being built. In some aspects, top-side etching operations provide greater accuracy than bottom-side etching. The top-side pattern and etch of the first oxide layer 580 provides a more accurate positioning of the edges 511, 512 at the base of the cantilevered beams. Photoresist added in the gap area that will become part of the acoustic aperture can be added along the edge defined by the top-side pattern and edge, and this photoresist can be removed when the back-side etch is used to remove areas of the silicon substrate 590, leaving the more accurate top-side etched edges 511, 512 merged with the back-side etched gap as part of the acoustic aperture 599.

Figure 6A:
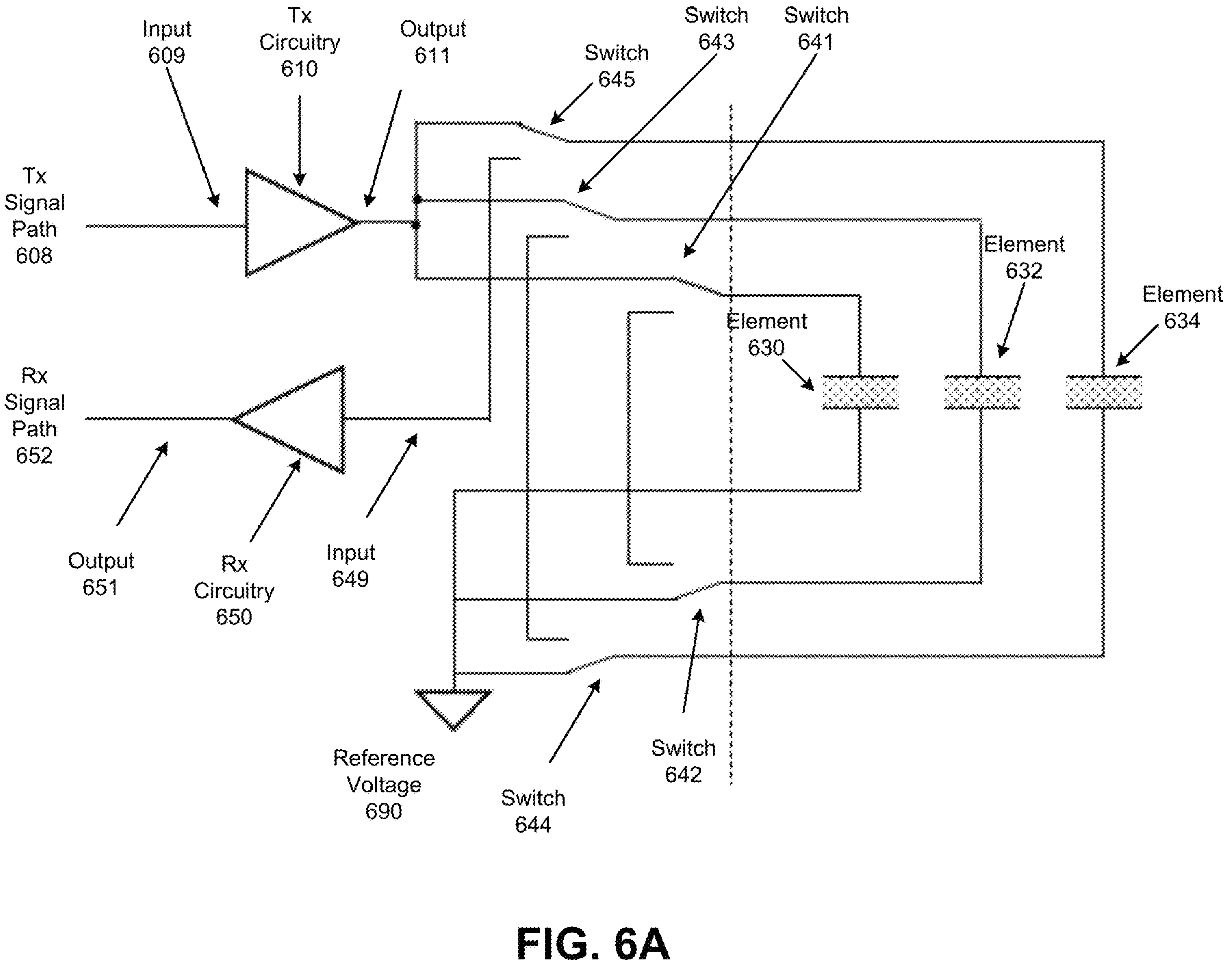
FIG. 6A illustrates aspects of an acoustic resonator configured for transmit operations with improved performance in accordance with aspects described herein.
Figure 6B:
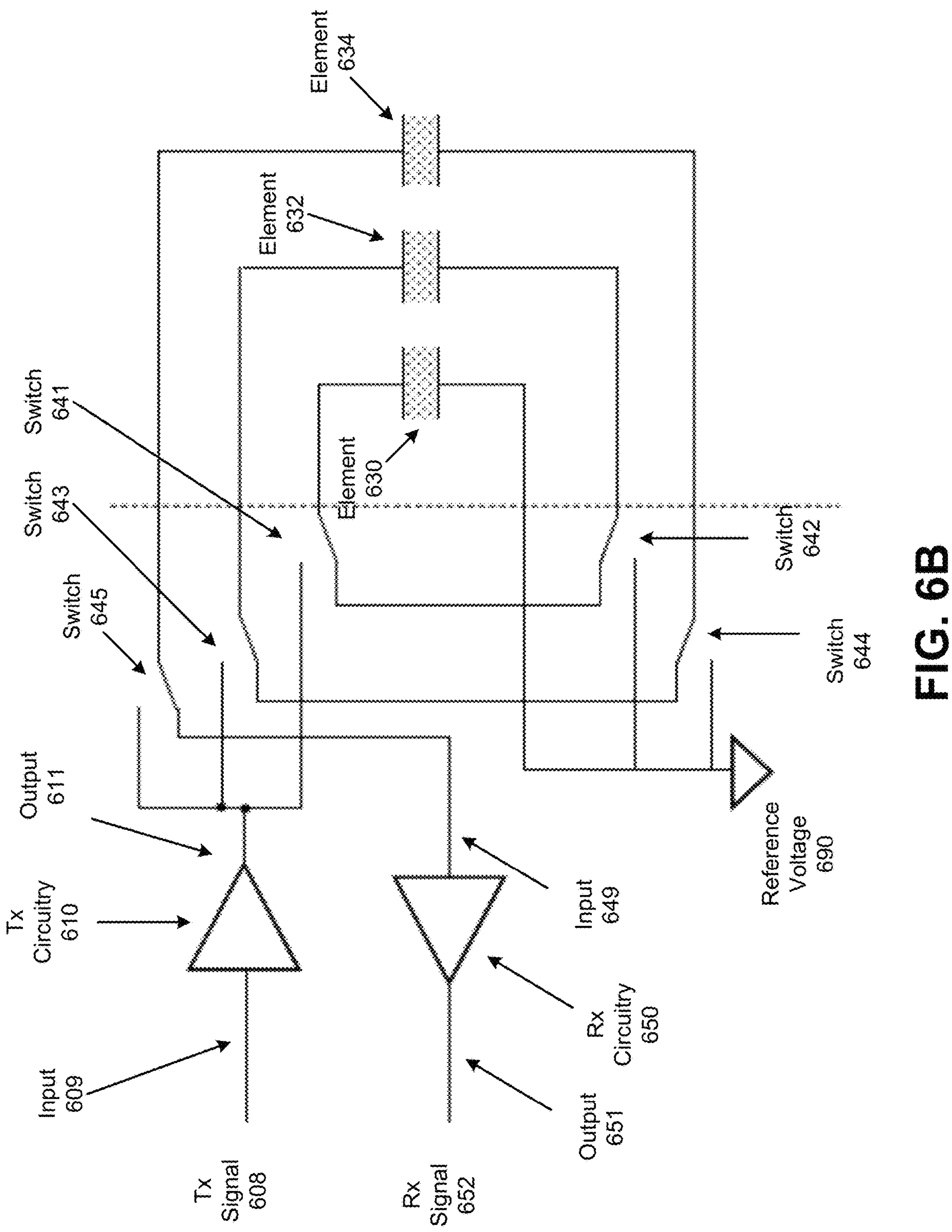
FIG. 6B illustrates aspects of an acoustic resonator configured for receive operations with improved performance in accordance with aspects described herein.

FIGS. 6A and 6B illustrates aspects of an acoustic transducer such as for a PMUT implementation configured for transmit operations with improved performance in accordance with aspects described herein. The illustrated system of FIG. 6A can be an implementation of switching circuitry 50, Tx circuitry 52, Rx circuitry 53, coupled to a MEMS chip 12 as illustrated in FIG. 1A. As described above, acoustic transceivers can both create audio signals from electrical inputs and generate electrical outputs from audio signals. PMUTs operating at ultrasonic frequencies can use ultrasonic pulses and received reflections of the ultrasonic pulses for ranging and object detection, among other applications. Transmit and receive operations of an acoustic transducer or array of transducers, however, have different limitations and design considerations. Aspects described herein can use switching or routing circuitry to configure elements of an acoustic transducer differently for transmit and receive mode operation to improve the performance of both modes separately. For example, transmit capability can be limited by a magnitude of a voltage generated by the Tx circuitry. For this reason, a figure of merit for an acoustic transceiver is the displacement (SPL) level generated for a given applied voltage (SPL/V). Driving the independent elements of an acoustic transducer (e.g., different electrode layers or beams, depending on the design as discussed above with respect to FIG. 5A) in parallel to achieve a larger SPL/V performance.

In receive or sensing mode operation, however, improved performance is given by improved sensitivity, with units of decibels (dB) per unit of pressure such as a Pascal (dB/Pa). Additional sensitivity is provided by a configuration where the independent sensing elements are wired in series so that the voltage of multiple sensing elements are added together for a greater sensitivity performance.

FIGS. 6A and 6B show an example system for three transducer elements 630, 632, and 634 that can be reconfigured between parallel and serial configurations by switching or routing circuitry. As described above, a conductor of a piezoelectric stack (e.g., elements of electrode layers 531, 532, 533, etc.) provide a voltage signal generated from a piezoelectric layer (e.g., piezoelectric layer 521) proportional to the deflection of a beam including the conductor. The transducer elements 630, 632, and 634 can be conductors within a single beam, or can be separate beams. In various aspects, any combination of separate conductors within a beam, multiple beams, or multiple transducer beam arrays can be combined in various ways to create a transducer element that is switched in accordance with aspects described herein.

The illustrated system includes three elements 630, 632, and 634, with corresponding switches 641, 642, 643, 644, and 645. While FIGS. 6A and 6B show three elements and corresponding switching, any number of elements can be used in different implementations. While single throw switches connecting a fixed end between two points are shown, other aspects can use other switching or routing circuitry to achieve similar results.

The illustrated system includes a transmit signal path 608 with input node 609 and output node 611 for Tx circuitry 610 coupled to three switches. Similarly, a receive signal path 652 has an output node 651 and an input node 649 for receive circuitry 650. The elements 630, 632, and 634 (e.g., piezoelectric beams, or electrode layers coupled to piezoelectric layers within a beam) each have a transducer connection point (e.g., a top point of each element 630, 632, 634 corresponding to a node such as the nodes 551 or 552) and a reference voltage connection point (e.g., a ground connection point represented by the bottom of each element 630, 632, and 634). In FIG. 6A, the elements 630, 632, 634 are shown in a transmit mode configuration in parallel between the transmit signal path 608 and the reference voltage 690. In FIG. 6B, the elements 630, 632, and 634 are shown in a receive mode configuration in series between the receive signal path 652 and the reference voltage 690.

Control circuitry (not shown, which may be the processor 810 of FIG. 8, the controller 58 of FIG. 1B, or any other such control circuitry) coupled to the switches 641-645 can be set to transmit or receive modes, and can set the switches as shown to alternate between the transmit mode with the elements 630, 632, 634 in parallel and a receive mod with the elements 630, 632, 634 in series.

The illustrated system of FIGS. 6A and 6B can be implemented with two elements, or any number of element N, using (2N−1) switches, with one element coupled directly to the reference voltage 690, and each other element (e.g., or groups of elements fixed in a given connection) coupled to two switches to reconfigure the elements between parallel and serial operation.

Various fabrication and operation methods can be performed in accordance with the aspects described herein. For example, in accordance with one method, control circuitry can perform operations for selecting a receive mode, configuring, using switching circuitry a first electrode layer and a second electrode layer of one or more piezoelectric transducers in series between a reference node and a receive signal path node, in response to selection of the receive mode, selecting, using the control circuitry of the piezoelectric device, a transmit mode, and configuring, using the switching circuitry selected by the control circuitry, the first electrode layer and the second electrode layer of one or more piezoelectric transducers in parallel between a reference node and a transmit signal path node, in response to selection of the transmit mode. In other aspects, other such methods can be used with different switching or routing circuits in accordance with aspects described herein. Such a method can be implemented by an acoustic transducer system, such as a system integrated with a device within a computing system or device (e.g., a computing system 800) as described below. In some aspects, such a method is implemented as computer readable instructions in a storage medium that, when executed by processing circuitry of a device, cause the device to perform the operations of the method.

Some aspects comprise multiple cantilevered beams or conductor elements of a piezoelectric acoustic transceiver and switching means to configure the elements between parallel and serial connection based on an operating mode.

Figure 7:
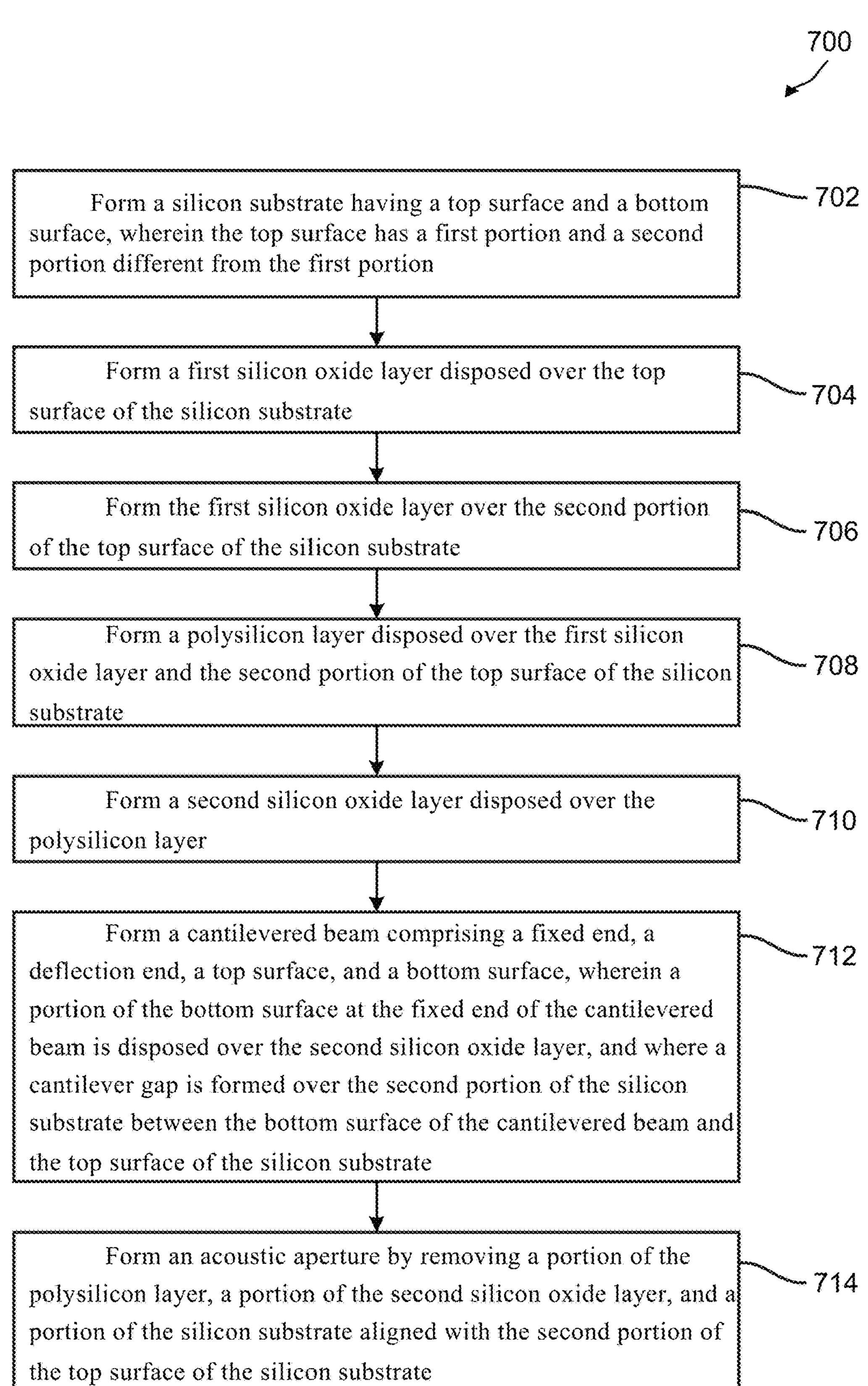
FIG. 7 is a flowchart illustrating aspects of a method for fabricating an acoustic resonator in accordance with aspects described herein.

FIG. 7 illustrates a method associated with piezoelectric MEMS contact detection systems in devices in accordance with aspects described herein. FIG. 7 illustrates an example method 700 for fabrication of an acoustic transducer system (e.g., a system in accordance with any aspect described above). In some aspects, the method 700 is implemented by a transducer system, such as a system integrated with a device within a computing system or device (e.g., a computing system 800) as described below. In some aspects, the method 700 is implemented as computer readable instructions in a storage medium that, when executed by processing circuitry of a device, cause the device to perform the operations of the method 700 described in the blocks below. The method 700 illustrates one example aspect in accordance with the details provided herein. It will be apparent that other methods, including methods with intervening or repeated operations, are possible in accordance with the aspects described herein.

The method 700 includes block 702, which describes forming a silicon substrate having a top surface and a bottom surface, wherein the top surface has a first portion and a second portion different from the first portion.

The method 700 includes block 704, which describes forming a first silicon oxide layer disposed over the first portion of the top surface of the silicon substrate;

The method 700 includes block 706, which describes removing the first silicon oxide layer over the second portion of the top surface of the silicon substrate;

The method 700 includes block 708, which describes forming a polysilicon layer disposed over the silicon oxide layer and the second portion of the top surface of the silicon substrate;

The method 700 includes block 710, which describes forming a second silicon oxide layer disposed over the polysilicon layer;

The method 700 includes block 712, which describes forming a cantilevered beam comprising a fixed end, a deflection end, a top surface, and a bottom surface, where a portion of the bottom surface at the fixed end of the cantilevered beam is disposed over the second silicon oxide layer, and where a cantilever gap is formed over the second portion of the silicon substrate between the bottom surface of the cantilevered beam and the top surface of the silicon substrate; and The method 700 includes block 714, which describes forming an acoustic aperture by removing a portion of the polysilicon layer, a portion of the second silicon oxide layer, and a portion of the silicon substrate aligned with the second portion of the top surface of the silicon substrate.

In some aspects, the method 700 is performed where the acoustic aperture is formed using an top-side etching through the first silicon oxide layer, the polysilicon layer and the second silicon oxide layer and bottom-side etching through the silicon substrate to etch process to form edges an edge of the acoustic aperture. Other aspects, additional operations, intervening operations, or repeated operations can be performed with the method 700 in the fabrication of any device described herein. Similarly, other such methods can be used to fabricate acoustic transducers in accordance with the aspects described herein.

Figure 8:
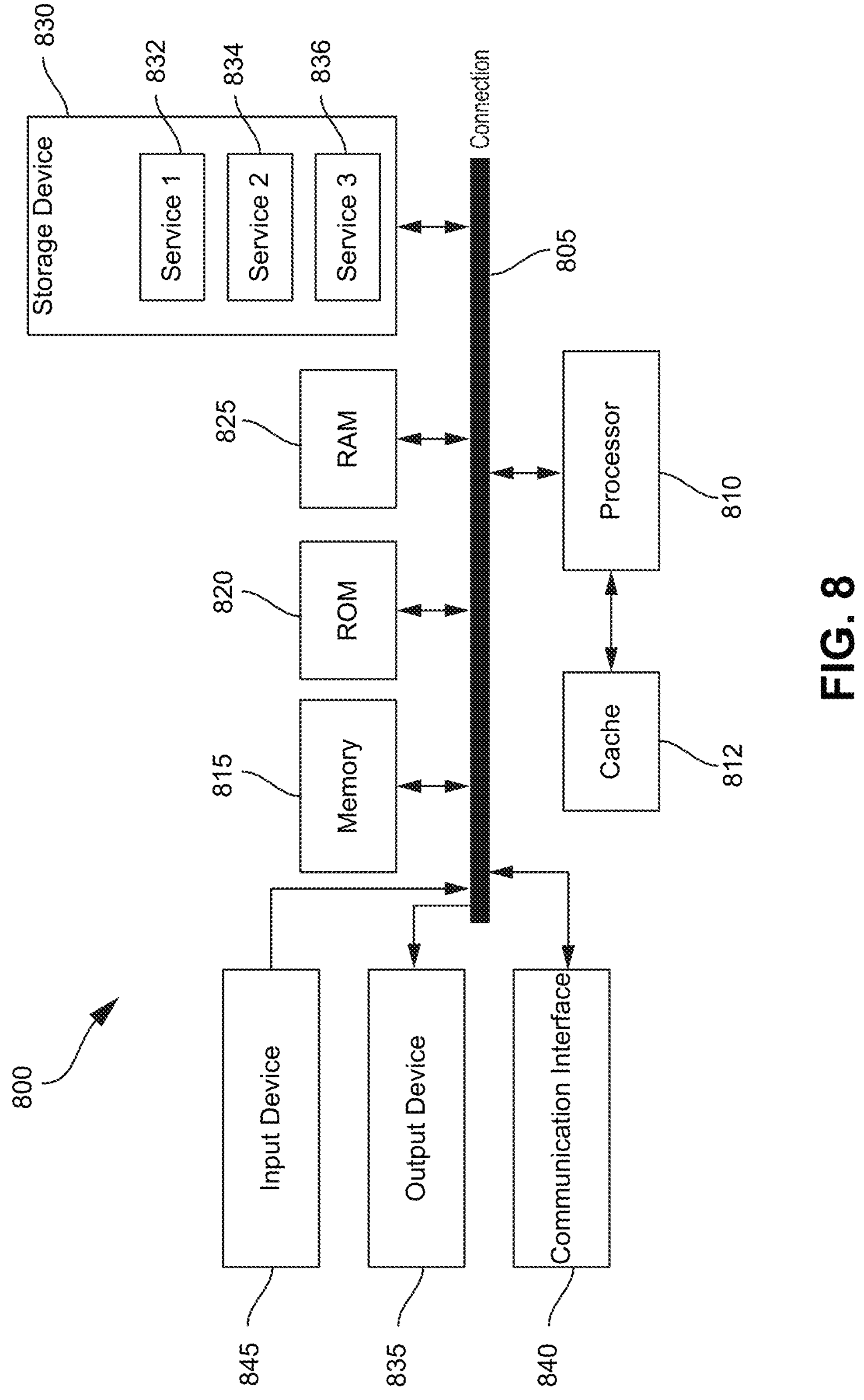
FIG. 8 is a block diagram of a computing device that can be used with implementations of an acoustic resonator device in accordance with aspects described herein.

FIG. 8 is a diagram illustrating an example of a system for implementing certain aspects of the present technology. In particular, FIG. 8 illustrates an example of computing system 800 which can include a MEMS transducer system (e.g., a MEMS transducer system including a piezoelectric MEMS acoustic transducer implemented as a PMUT as described above) in accordance with aspects described herein. The acoustic transducer (e.g., the piezoelectric MEMS acoustic transducer and an associated MEMS transducer system) can be integrated, for example, with any computing device making up internal computing system, a remote computing system, a camera, or any component thereof in which the components of the system are in communication with each other using connection 805. Connection 805 may be a physical connection using a bus, or a direct connection into processor 810, such as in a chipset architecture. Connection 805 may also be a virtual connection, networked connection, or logical connection.

Example system 800 includes at least one processing unit (CPU or processor) 810 and connection 805 that communicatively couples various system components including system memory 815, such as read-only memory (ROM) 820 and random access memory (RAM) 825 to processor 810. Computing system 800 may include a cache 812 of high-speed memory connected directly with, in close proximity to, or integrated as part of processor 810.

Processor 810 may include any general purpose processor and a hardware service or software service, such as services 832, 834, and 836 stored in storage device 830, configured to control processor 810 as well as a special-purpose processor where software instructions are incorporated into the actual processor design. Processor 810 may essentially be a completely self-contained computing system, containing multiple cores or processors, a bus, memory controller, cache, etc. A multi-core processor may be symmetric or asymmetric.

To enable user interaction, computing system 800 includes an input device 845, which may represent any number of input mechanisms, such as a microphone for speech or audio detection (e.g., piezoelectric MEMS transducer or a MEMS transducer system in accordance with aspects described above, etc.) along with other input devices 845 such as a touch-sensitive screen for gesture or graphical input, keyboard, mouse, motion input, speech, etc. Computing system 800 may also include output device 835, which may be one or more of a number of output mechanisms. Such output mechanisms can, for example, be a display screen or a touch screen of a mobile device, a communication port, a speaker, or any other such output device. In some instances, multimodal systems may enable a user to provide multiple types of input/output to communicate with computing system 800.

Computing system 800 may include communications interface 840, which may generally govern and manage the user input and system output. The communication interface may perform or facilitate receipt and/or transmission wired or wireless communications using wired and/or wireless transceivers, including those making use of an audio jack/plug, a microphone jack/plug, a universal serial bus (USB) port/plug, an Apple™ Lightning™ port/plug, an Ethernet port/plug, a fiber optic port/plug, a proprietary wired port/plug, 3G, 4G, 5G and/or other cellular data network wireless signal transfer, a Bluetooth™ wireless signal transfer, a Bluetooth™ low energy (BLE) wireless signal transfer, an IBEACON™ wireless signal transfer, a radio-frequency identification (RFID) wireless signal transfer, near-field communications (NFC) wireless signal transfer, dedicated short range communication (DSRC) wireless signal transfer, 802.11 Wi-Fi wireless signal transfer, wireless local area network (WLAN) signal transfer, Visible Light Communication (VLC), Worldwide Interoperability for Microwave Access (WiMAX), Infrared (IR) communication wireless signal transfer, Public Switched Telephone Network (PSTN) signal transfer, Integrated Services Digital Network (ISDN) signal transfer, ad-hoc network signal transfer, radio wave signal transfer, microwave signal transfer, infrared signal transfer, visible light signal transfer, ultraviolet light signal transfer, wireless signal transfer along the electromagnetic spectrum, or some combination thereof. The communications interface 840 may also include one or more Global Navigation Satellite System (GNSS) receivers or transceivers that are used to determine a location of the computing system 800 based on receipt of one or more signals from one or more satellites associated with one or more GNSS systems. GNSS systems include, but are not limited to, the US-based Global Positioning System (GPS), the Russia-based Global Navigation Satellite System (GLONASS), the China-based BeiDou Navigation Satellite System (BDS), and the Europe-based Galileo GNSS. There is no restriction on operating on any particular hardware arrangement, and therefore the basic features here may easily be substituted for improved hardware or firmware arrangements as they are developed.

Storage device 830 may be a non-volatile and/or non-transitory and/or computer-readable memory device and may be a hard disk or other types of computer readable media which may store data that are accessible by a computer, such as magnetic cassettes, flash memory cards, solid state memory devices, digital versatile disks, cartridges, a floppy disk, a flexible disk, a hard disk, magnetic tape, a magnetic strip/stripe, any other magnetic storage medium, flash memory, memristor memory, any other solid-state memory, a compact disc read only memory (CD-ROM) optical disc, a rewritable compact disc (CD) optical disc, digital video disk (DVD) optical disc, a blu-ray disc (BDD) optical disc, a holographic optical disk, another optical medium, a secure digital (SD) card, a micro secure digital (microSD) card, a Memory Stick® card, a smartcard chip, a EMV chip, a subscriber identity module (SIM) card, a mini/micro/nano/pico SIM card, another integrated circuit (IC) chip/card, random access memory (RAM), static RAM (SRAM), dynamic RAM (DRAM), read-only memory (ROM), programmable read-only memory (PROM), erasable programmable read-only memory (EPROM), electrically erasable programmable read-only memory (EEPROM), flash EPROM (FLASHEPROM), cache memory (e.g., Level 1 (L1) cache, Level 2 (L2) cache, Level 3 (L3) cache, Level 4 (L4) cache, Level 5 (L5) cache, or other (L #) cache), resistive random-access memory (RRAM/ReRAM), phase change memory (PCM), spin transfer torque RAM (STT-RAM), another memory chip or cartridge, and/or a combination thereof.

The storage device 830 may include software services, servers, services, etc., that when the code that defines such software is executed by the processor 810, it causes the system to perform a function. In some embodiments, a hardware service that performs a particular function may include the software component stored in a computer-readable medium in connection with the necessary hardware components, such as processor 810, connection 805, output device 835, etc., to carry out the function. The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data may be stored and that does not include carrier waves and/or transitory electronic signals propagating wirelessly or over wired connections. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Specific details are provided in the description above to provide a thorough understanding of the embodiments and examples provided herein, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described application may be used individually or jointly. Further, embodiments may be utilized in any number of environments and applications beyond those described herein without departing from the broader scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

For clarity of explanation, in some instances the present technology may be presented as including individual functional blocks including devices, device components, steps or routines in a method embodied in software, or combinations of hardware and software. Additional components may be used other than those shown in the figures and/or described herein. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Individual embodiments may be described above as a process or method which is depicted as a flowchart, a flow diagram, a data flow diagram, a structure diagram, or a block diagram. Although a flowchart may describe the operations as a sequential process, many of the operations may be performed in parallel or concurrently. In addition, the order of the operations may be re-arranged. A process is terminated when its operations are completed but could have additional steps not included in a figure. A process may correspond to a method, a function, a procedure, a subroutine, a subprogram, etc. When a process corresponds to a function, its termination may correspond to a return of the function to the calling function or the main function.

Processes and methods according to the above-described examples may be implemented using computer-executable instructions that are stored or otherwise available from computer-readable media. Such instructions may include, for example, instructions and data which cause or otherwise configure a general purpose computer, special purpose computer, or a processing device to perform a certain function or group of functions. Portions of computer resources used may be accessible over a network. The computer executable instructions may be, for example, binaries, intermediate format instructions such as assembly language, firmware, source code. Examples of computer-readable media that may be used to store instructions, information used, and/or information created during methods according to described examples include magnetic or optical disks, flash memory, USB devices provided with non-volatile memory, networked storage devices, and so on.

In some embodiments the computer-readable storage devices, mediums, and memories may include a cable or wireless signal containing a bitstream and the like. However, when mentioned, non-transitory computer-readable storage media expressly exclude media such as energy, carrier signals, electromagnetic waves, and signals per se.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof, in some cases depending in part on the particular application, in part on the desired design, in part on the corresponding technology, etc.

The various illustrative logical blocks, modules, and circuits described in connection with the aspects disclosed herein may be implemented or performed using hardware, software, firmware, middleware, microcode, hardware description languages, or any combination thereof, and may take any of a variety of form factors. When implemented in software, firmware, middleware, or microcode, the program code or code segments to perform the necessary tasks (e.g., a computer-program product) may be stored in a computer-readable or machine-readable medium. A processor(s) may perform the necessary tasks. Examples of form factors include laptops, smart phones, mobile phones, tablet devices or other small form factor personal computers, personal digital assistants, rackmount devices, standalone devices, and so on. Functionality described herein also may be embodied in peripherals or add-in cards. Such functionality may also be implemented on a circuit board among different chips or different processes executing in a single device, by way of further example.

The instructions, media for conveying such instructions, computing resources for executing them, and other structures for supporting such computing resources are example means for providing the functions described in the disclosure.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium including program code including instructions that, when executed, performs one or more of the methods, algorithms, and/or operations described above. The computer-readable data storage medium may form part of a computer program product, which may include packaging materials. The computer-readable medium may include memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that may be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general-purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein.

Where components are described as being "configured to" perform certain operations, such configuration may be accomplished, for example, by designing electronic circuits or other hardware to perform the operation, by programming programmable electronic circuits (e.g., microprocessors, or other suitable electronic circuits) to perform the operation, or any combination thereof.

The phrase "coupled to" or "communicatively coupled to" refers to any component that is physically connected to another component either directly or indirectly, and/or any component that is in communication with another component (e.g., connected to the other component over a wired or wireless connection, and/or other suitable communication interface) either directly or indirectly.

A number of implementations have been described. Nevertheless, it will be understood that various modifications may be made without departing from the spirit and scope of the disclosure. Other embodiments are within the scope of the claims.

A first set of illustrative aspects of the disclosure include:

Aspect 1. An acoustic transducer comprising: a silicon substrate having a top surface and a bottom surface, wherein the top surface has a first portion and an edge along the first portion associated with an acoustic aperture; a first silicon oxide layer disposed over the first portion of the top surface of the silicon substrate; a polysilicon layer disposed over the first silicon oxide layer; a second silicon oxide layer disposed over the polysilicon layer; and a cantilevered beam comprising a fixed end, a deflection end, a top surface, and a bottom surface, wherein a first portion of the bottom surface at the fixed end of the cantilevered beam is disposed over the second silicon oxide layer, wherein a second portion of the bottom surface at the deflection end is formed over the acoustic aperture.

Aspect 2. The acoustic transducer of Aspect 1, wherein the cantilevered beam comprises a first piezoelectric layer and a second piezoelectric layer separated by a conductor layer.

Aspect 3. The acoustic transducer of Aspect 2, wherein the cantilevered beam further comprises a top conductor layer and a bottom conductor layer, wherein the first piezoelectric layer and the second piezoelectric layer are between the top conductor layer and the bottom conductor layer of the cantilevered beam.

Aspect 4. The acoustic transducer of Aspect 3, wherein the first piezoelectric layer and the second piezoelectric layer comprise Aluminum Nitride (AlN), and wherein the top conductor layer, the bottom conductor layer, and the conductor layer comprise Molybdenum (Mo).

Aspect 5. The acoustic transducer of Aspect 4, wherein the cantilevered beam comprises a triangle having a base at the fixed end and a tip at the deflection end.

Aspect 6. The acoustic transducer of Aspect 5, wherein the cantilevered beam has a length from the base to the tip of 144 micrometers.

Aspect 7. The acoustic transducer of any of Aspects 1 to 5, wherein a thickness of the first piezoelectric layer and a thickness of the second piezoelectric layer is approximately 500 nanometers (nm), wherein a thickness of each of the top conductor layer, the bottom conductor layer, and the conductor layer is approximately 20 nm, and wherein the acoustic transducer has a resonance frequency of approximately 160 kilohertz (kHz).

Aspect 8. The acoustic transducer of any of Aspects 1 to 5, wherein the acoustic transducer has an average transmit displacement of approximately of 12.6 nanometers per volt (nm/V) and an approximate receive sensitivity of 130 microvolts per pascal (uV/Pa).

Aspect 9. The acoustic transducer of any of Aspects 1 to 5, wherein the first piezoelectric layer and the second piezoelectric layer are formed of Aluminum Scandium Nitride (AlN).

Aspect 10. The acoustic transducer of any of Aspects 1 to 9, wherein the top conductor layer, the bottom conductor layer, and the conductor layer are formed of Platinum.

Aspect 11. The acoustic transducer of any of Aspects 1 to 5, wherein the cantilevered beam comprises a triangle having a base at the fixed end and a tip at the deflection end, with a length from the base to the tip of 115 micrometers.

Aspect 12. The acoustic transducer of any of Aspects 1 to 5, wherein a thickness of the first piezoelectric layer and a thickness of the second piezoelectric layer is approximately 400 nanometers (nm), and wherein the acoustic transducer has a resonance frequency of approximately 161 kilohertz (kHz).

Aspect 13. The acoustic transducer of any of Aspects 1 to 5, wherein the acoustic transducer has an average transmit volume displacement of approximately of 39 nm/V and an approximate receive sensitivity of 187 uV/Pa.

Aspect 14. The acoustic transducer of any of Aspects 3 to 13, further comprising a plurality of cantilevered beams including the cantilevered beam, each of the plurality of cantilevered beams comprising a corresponding fixed end, a corresponding deflection end, a corresponding top surface, and a corresponding bottom surface; wherein the corresponding fixed end of each of the plurality of cantilevered beams is formed on the polysilicon layer over the first portion of the silicon substrate; and wherein the corresponding deflection end of each of the plurality of cantilevered beams is formed over the acoustic aperture.

Aspect 15. The acoustic transducer of any of Aspects 3 to 14, wherein the corresponding top surface of each of the plurality of cantilevered beams is a rectangular shape.

Aspect 16. The acoustic transducer of any of Aspects 3 to 15, wherein the corresponding top surface of each of the plurality of cantilevered beams is a triangular shape with a triangle base at the corresponding fixed end and a tip a the corresponding deflection end; and wherein the plurality of cantilevered beams and gaps between adjacent beams of the plurality of cantilevered beams enclose a symmetrical polygonal shape.

Aspect 17. The acoustic transducer of any of Aspects 3 to 16, wherein the cantilevered beam comprises a conductive contact electrically coupled to at least one conductor layer of the cantilevered beam.

Aspect 18. The acoustic transducer of any of Aspects 1 to 17 further comprising an application specific integrated circuit (ASIC) coupled to the conductive contact via a bond wire.

Aspect 19. The acoustic transducer of any of Aspects 1 to 18 further comprises a package lid and a package substrate surrounding the cantilevered beam, wherein the silicon substrate is mounted to the package substrate.

Aspect 20. The acoustic transducer of any of Aspects 1 to 19, wherein the package substrate comprises a portion of the acoustic aperture configured to provide an acoustic path to the cantilevered beam.

Aspect 21. The acoustic transducer of any of Aspects 1 to 20, wherein the acoustic aperture forms a via through the silicon substrate.

Aspect 22. The acoustic transducer of any of Aspects 1 to 21, further comprising processing circuitry and a display screen coupled to the ASIC.

Aspect 23. The acoustic transducer of any of Aspects 18 to 22, wherein an edge of the first silicon oxide layer, an edge of the polysilicon layer and an edge of the second silicon oxide layer formed by top-side etching align with the edge of the silicon substrate along a boundary between the first portion of the bottom surface of the cantilevered beam and the second portion of the bottom surface of the cantilevered beam.

Aspect 24. The acoustic transducer of any of Aspects 1 to 23, wherein the edge of the second silicon oxide layer modifies a resonance of the acoustic transducer by modifying a resonance frequency of the cantilevered beam.

Aspect 25. An acoustic transducer comprising: a silicon substrate having a top surface and a bottom surface, wherein the top surface has a first portion and an edge associated with an acoustic aperture; a first silicon oxide layer formed over the first portion of the top surface of the silicon substrate; a polysilicon layer formed over the silicon oxide layer; a second silicon oxide layer formed over the polysilicon layer; and a plurality of cantilevered beams each comprising a fixed end, a deflection end, a top surface, and a bottom surface, wherein the fixed end of each cantilevered beam is disposed on the second silicon oxide layer and formed over the first portion of the silicon substrate, and wherein the deflection end of each cantilevered beam is formed over the acoustic aperture.

Aspect 26. The acoustic transducer of Aspect 25 further comprises a package lid and a package substrate surrounding the cantilevered beam, wherein the silicon substrate is mounted to the package substrate; and wherein the package substrate comprises an acoustic aperture configured to provide an acoustic path to the plurality of cantilevered beams.

Aspect 27. The acoustic transducer of any of Aspects 25 to 26, wherein the acoustic transducer is a piezoelectric micromachined ultrasonic transducer (PMUT) device configured to operate with an ultrasonic resonance frequency at or above 40 kilohertz (kHz).

Aspect 28. A method of forming an acoustic transducer, the method comprising: forming a silicon substrate having a top surface and a bottom surface, wherein the top surface has a first portion and a second portion different from the first portion; forming a first silicon oxide layer disposed over the top surface of the silicon substrate; removing the first silicon oxide layer over the second portion of the top surface of the silicon substrate; forming a polysilicon layer disposed over the first silicon oxide layer and the second portion of the top surface of the silicon substrate; forming a second silicon oxide layer disposed over the polysilicon layer; forming a cantilevered beam comprising a fixed end, a deflection end, a top surface, and a bottom surface, wherein a portion of the bottom surface at the fixed end of the cantilevered beam is disposed over the second silicon oxide layer, and where a cantilever gap is formed over the second portion of the silicon substrate between the bottom surface of the cantilevered beam and the top surface of the silicon substrate; and forming an acoustic aperture by removing a portion of the polysilicon layer, a portion of the second silicon oxide layer, and a portion of the silicon substrate aligned with the second portion of the top surface of the silicon substrate.

Aspect 29. The method of Aspect 28, wherein the acoustic aperture is formed using top-side etching through the first silicon oxide layer, the polysilicon layer and the second silicon oxide layer and bottom-side etching through the silicon substrate to form an edge of the acoustic aperture.

Aspect 30. A piezoelectric micromachined ultrasonic transducer (PMUT) device comprising: a cantilevered beam comprising a fixed end, a deflection end, a top surface, and a bottom surface; means for supporting the fixed end of the cantilevered beam having an edge formed by a top-side etch process to provide an accurate length of the deflection end of the cantilevered beam.

Aspect 31. A microelectromechanical (MEMS) transducer, comprising means for providing an output signal in accordance with any aspect herein.

Aspect 32. A method for operating any MEMS transducer described herein.

A second set of illustrative aspects of the disclosure includes:

Aspect 1. A device comprising: a transmit signal path node; a receive signal path node; a first electrode layer coupled to a first piezoelectric layer, the first electrode layer having a transducer connection point and a reference voltage connection point, wherein the reference voltage connection point is coupled to a reference node; a second electrode layer coupled to a second piezoelectric layer, the second electrode layer having a transducer connection point and a reference voltage connection point; and switching circuitry; wherein the switching circuitry is configurable to couple the first electrode layer and the second electrode layer in series between the reference node and the receive signal path node in a first configuration and to couple the first electrode layer and the second electrode layer in parallel between the reference node and the transmit signal path node in a second configuration.

Aspect 2. The device of Aspect 1, wherein the first electrode layer and the second electrode layer are positioned together with the first piezoelectric layer and the second piezoelectric layer in a single cantilevered beam.

Aspect 3. The device of any of Aspects 1 to 2, further comprising: a first cantilevered beam comprising the first electrode layer and the first piezoelectric layer; and a second cantilevered beam comprising the second electrode layer and the second piezoelectric layer.

Aspect 4. The device of Aspect 3, wherein the switching circuitry comprises: a first switch having a first input node, a second input node, and a output node, wherein the first input node is coupled to the transmit signal path node, and wherein the output node is coupled to the transducer connection point of the first cantilevered beam; a second switch having a first input node, a second input node, and a output node, wherein the first input node is coupled to the reference node, and wherein the second input node is coupled to the second input node of the first switch; and a third switch having a first input node, a second input node, and a output node, wherein the first input node is coupled to the transmit signal path node, wherein the second input node is coupled to the receive signal path node, and wherein the output node is coupled to the transducer connection point of the second cantilevered beam.

Aspect 5. The device of Aspect 4, further comprising a third cantilevered beam having a transducer connection point and a reference voltage connection point.

Aspect 6. The device of Aspect 3, wherein the switching circuitry comprises: a first switch having a first input node, a second input node, and a output node, wherein the first input node is coupled to the transmit signal path node, and wherein the output node is coupled to the transducer connection point of the first cantilevered beam; a second switch having a first input node, a second input node, and a output node, wherein the first input node is coupled to the reference node, wherein the second input node is coupled to the second input node of the first switch, and wherein the output node is coupled to the reference voltage connection point of the second switch; a third switch having a first input node, a second input node, and a output node, wherein the first input node is coupled to the transmit signal path node, and wherein the output node is coupled to the transducer connection point of the second cantilevered beam; a fourth switch having a first input node, a second input node, and a output node, wherein the first input node is coupled to the reference node, and wherein the second input node is coupled to the second input node of the second switch, and wherein the output node is coupled to the reference voltage connection point of the third switch; and a fifth switch having a first input node, a second input node, and a output node, wherein the first input node is coupled to the transmit signal path node, wherein the second input node is coupled to the receive signal path node, and wherein the output node is coupled to the transducer connection point of the third cantilevered beam.

Aspect 7. The device of any of Aspects 3 through 6 comprising a first set of cantilevered beams, a second set of cantilevered beams, and a third set of cantilevered beams; wherein the first set of cantilevered beams comprises the first cantilevered beam; wherein the second set of cantilevered beams comprises the second cantilevered beam; and wherein the third set of cantilevered beams comprises the third cantilevered beam.

Aspect 8. The device of Aspect 7 wherein each cantilevered beam of the first set of cantilevered beams are coupled in parallel to generate a single ended output signal at the transducer connection point of the first cantilevered beam.

Aspect 9. The device of Aspect 8 wherein a first half of the first set of cantilevered beams are coupled in parallel with a first polarity and a second half of the first set of cantilevered beams are coupled in parallel with an opposite polarity generate a differential output signal at the transducer connection point of the first cantilevered beam.

Aspect 10. The device of Aspect 9, further comprising a plurality of intermediate cantilevered beams each comprising a corresponding transducer connection point and a corresponding reference voltage connection point; wherein the switching circuitry is further configured to connect each cantilevered beam of the plurality of intermediate cantilevered beams, the first cantilevered beam, and the second cantilevered beam in series between the reference node and the receive signal path node in the first configuration and in parallel between the reference node and the transmit signal path node in the second configuration.

Aspect 11. The device of Aspect 10, wherein the plurality of intermediate cantilevered beams includes six cantilevered beams.

Aspect 12. The device of Aspect 11, wherein the plurality of intermediate cantilevered beams includes fourteen cantilevered beams configured in a first piezoelectric micromachined ultrasonic transducer (PMUT) and a second PMUT, wherein the first PMUT comprises eight cantilevered beams including the first cantilevered beam, and wherein and the second PMUT comprises eight cantilevered beams including the second cantilevered beam.

Aspect 13. The device of any of Aspects 10 to 12, wherein the eight cantilevered beams of the first PMUT are positioned such that the eight cantilevered beams of the first PMUT and associated gaps between adjacent cantilevered beams of the eight cantilevered beams enclose a symmetrical polygonal shape.

Aspect 14. The device of any of Aspects 10 to 13, wherein a shared parallel capacitance of the first cantilevered beam, the second cantilevered beam, and the plurality of intermediate cantilevered beams is greater than 0.5 picofarads in the second configuration.

Aspect 15. The device of any of Aspects 10 to 14 further comprising receive circuitry coupled to the receive signal path node; wherein an input capacitance of the receive circuitry has a value that is less than 10% of a value of a shared parallel capacitance of the first cantilevered beam, the second cantilevered beam, and the plurality of intermediate cantilevered beams in the second configuration.

Aspect 16. The device of any of Aspects 3 to 15, wherein the first cantilevered beam and the second cantilevered beam each comprise a top surface having a triangular shape.

Aspect 17. The device of any of Aspects 1 to 16 further comprising control circuitry coupled to the switching circuitry to select between connecting a first input or a second input of each switch of the switching circuitry and an output of each switch based on a device operating mode.

Aspect 18. The device of any of Aspects 1 to 17, wherein the device operating mode associated with the first configuration is a transmit mode, and wherein the device operating mode associated with the second configuration is a receive mode.

Aspect 19. The device of any of Aspects 1 to 18, further comprising a microelectromechanical (MEMS) chip; and an application specific integrated circuit (ASIC); wherein the MEMS chip comprises the first electrode layer and the second electrode layer; and wherein the ASIC comprises the switching circuitry, wherein the MEMS chip and the ASIC are electrically coupled via wire bonds.

Aspect 20. The device of any of Aspects 1 to 19, wherein the MEMS chip comprises a plurality of cantilevered piezoelectric beams each having a rectangular shape; and wherein the first electrode layer and the second electrode layer are positioned together with the first piezoelectric layer and the second piezoelectric layer in a single cantilevered beam of the plurality of cantilevered piezoelectric beams.

Aspect 21. A device comprising: an application specific integrated circuit (ASIC) comprising: a signal transmit input; a signal receive output; and routing circuitry; and a microelectromechanical (MEMS) chip comprising: a first cantilevered beam having a transducer connection point and a reference voltage connection point; and a second cantilevered beam having a transducer connection point and a reference voltage connection point; wherein the routing circuitry is configurable to couple the first cantilevered beam and the second cantilevered beam in series between a reference voltage and the signal receive output in a first configuration and to couple the first cantilevered beam and the second cantilevered beam in parallel between the reference voltage and the signal transmit input in a second configuration.

Aspect 22. The device of Aspect 21, wherein the routing circuitry comprises: a first switch having a first input node, a second input node, and a output node, wherein the first input node is coupled to the signal transmit input, and wherein the output node is coupled to the transducer connection point of the first cantilevered beam; a second switch having a first input node, a second input node, and a output node, wherein the first input node is coupled to the reference voltage connection point, and wherein the second input node is coupled to the second input node of the first switch; and a third switch having a first input node, a second input node, and a output node, wherein the first input node is coupled to the signal transmit input, wherein the second input node is coupled to the signal receive output, and wherein the output node is coupled to the transducer connection point of the second cantilevered beam.

Aspect 23. The device of any of Aspects 21 to 22, further comprising a third cantilevered beam having a transducer connection point and a reference voltage connection point.

Aspect 24. The device of Aspect 23, wherein the routing circuitry comprises: a first switch having a first input node, a second input node, and a output node, wherein the first input node is coupled to the signal transmit input, and wherein the output node is coupled to the transducer connection point of the first cantilevered beam; a second switch having a first input node, a second input node, and a output node, wherein the first input node is coupled to the reference voltage connection point, wherein the second input node is coupled to the second input node of the first switch, and wherein the output node is coupled to the reference voltage connection point of the second switch; a third switch having a first input node, a second input node, and a output node, wherein the first input node is coupled to the signal transmit input, and wherein the output node is coupled to the transducer connection point of the second cantilevered beam; a fourth switch having a first input node, a second input node, and a output node, wherein the first input node is coupled to the reference voltage connection point, and wherein the second input node is coupled to the second input node of the second switch, and wherein the output node is coupled to the reference voltage connection point of the third switch; and a fifth switch having a first input node, a second input node, and a output node, wherein the first input node is coupled to the signal transmit input, wherein the second input node is coupled to the signal receive output, and wherein the output node is coupled to the transducer connection point of the third cantilevered beam.

Aspect 25. The device of Aspect 23, further comprising a plurality of intermediate cantilevered beams each comprising a corresponding transducer connection point and a corresponding reference voltage connection point; wherein the routing circuitry is further configured to connect each cantilevered beam of the plurality of intermediate cantilevered beams, the first cantilevered beam, and the second cantilevered beam in series between the reference voltage connection point and the signal receive output in the first configuration and in parallel between the reference voltage connection point and the signal transmit input in the second configuration.

Aspect 26. The device of Aspect 25, wherein the plurality of intermediate cantilevered beams includes two cantilevered beams.

Aspect 27. The device of Aspect 26, wherein the first configuration is associated with a transmit operating mode, and wherein the second configuration is associated with a receive operating mode.

Aspect 28. The device of any of Aspects 21 to 27, further comprising: control circuitry; transmit circuitry comprising a power amplifier coupled between the control circuitry and the signal transmit input; and receive circuitry coupled between the control circuitry and the signal receive output.

Aspect 29. A method comprising: selecting, using control circuitry of a piezoelectric device, a receive mode; configuring, using switching circuitry selected by the control circuitry, a first electrode layer and a second electrode layer of one or more piezoelectric transducers in series between a reference node and a receive signal path node, in response to selection of the receive mode; selecting, using the control circuitry of the piezoelectric device, a transmit mode; and configuring, using the switching circuitry selected by the control circuitry, the first electrode layer and the second electrode layer of one or more piezoelectric transducers in parallel between a reference node and a transmit signal path node, in response to selection of the transmit mode.

Aspect 32. A method for fabricating and/or operating any MEMS transducer described herein.

What is claimed is:

1. An acoustic transducer comprising:
- a silicon substrate having a top surface and a bottom surface, wherein the top surface has a first portion and an edge along the first portion associated with an acoustic aperture;
- a first silicon oxide layer disposed over the first portion of the top surface of the silicon substrate;
- a polysilicon layer disposed over the first silicon oxide layer;
- a second silicon oxide layer disposed over the polysilicon layer; and
- a cantilevered beam comprising a fixed end, a deflection end, a top surface, and a bottom surface, wherein a first portion of the bottom surface at the fixed end of the cantilevered beam is disposed over the second silicon oxide layer, wherein a second portion of the bottom surface at the deflection end is formed over the acoustic aperture, and wherein the polysilicon layer forms at least a portion of a support stack configured to support the fixed end of the cantilevered beam.

2. The acoustic transducer of claim 1, wherein the cantilevered beam comprises a first piezoelectric layer and a second piezoelectric layer separated by a conductor layer.

3. The acoustic transducer of claim 2, wherein the cantilevered beam further comprises a top conductor layer and a bottom conductor layer, wherein the first piezoelectric layer and the second piezoelectric layer are between the top conductor layer and the bottom conductor layer of the cantilevered beam.

4. The acoustic transducer of claim 3, wherein the first piezoelectric layer and the second piezoelectric layer comprise Aluminum Nitride (AlN), and wherein the top conductor layer, the bottom conductor layer, and the conductor layer comprise Molybdenum (Mo).

5. The acoustic transducer of claim 4, wherein the cantilevered beam comprises a triangle having a base at the fixed end and a tip at the deflection end.

6. The acoustic transducer of claim 5, wherein the cantilevered beam has a length from the base to the tip of 144 micrometers.

7. The acoustic transducer of claim 5, wherein a thickness of the first piezoelectric layer and a thickness of the second piezoelectric layer is approximately 500 nanometers (nm), wherein a thickness of each of the top conductor layer, the bottom conductor layer, and the conductor layer is approximately 20 nm, and wherein the acoustic transducer has a resonance frequency of approximately 160 kilohertz (kHz).

8. The acoustic transducer of claim 7, wherein the acoustic transducer has an average transmit displacement of approximately of 12.6 nanometers per volt (nm/V) and an approximate receive sensitivity of 130 microvolts per pascal (uV/Pa).

9. The acoustic transducer of claim 3, wherein the first piezoelectric layer and the second piezoelectric layer are formed of Aluminum Scandium Nitride (AlN).

10. The acoustic transducer of claim 9, wherein the top conductor layer, the bottom conductor layer, and the conductor layer are formed of Platinum.

11. The acoustic transducer of claim 10, wherein the cantilevered beam comprises a triangle having a base at the fixed end and a tip at the deflection end, with a length from the base to the tip of 115 micrometers.

12. The acoustic transducer of claim 11, wherein a thickness of the first piezoelectric layer and a thickness of the second piezoelectric layer is approximately 400 nanometers (nm), and wherein the acoustic transducer has a resonance frequency of approximately 161 kilohertz (kHz).

13. The acoustic transducer of claim 12, wherein the acoustic transducer has an average transmit volume displacement of approximately of 39 nm/V and an approximate receive sensitivity of 187 uV/Pa.

14. The acoustic transducer of claim 1, further comprising a plurality of cantilevered beams including the cantilevered beam, each of the plurality of cantilevered beams comprising a corresponding fixed end, a corresponding deflection end, a corresponding top surface, and a corresponding bottom surface;

wherein the corresponding fixed end of each of the plurality of cantilevered beams is formed on the polysilicon layer over the first portion of the silicon substrate; and wherein the corresponding deflection end of each of the plurality of cantilevered beams is formed over the acoustic aperture.

15. The acoustic transducer of claim 14, wherein the corresponding top surface of each of the plurality of cantilevered beams is a rectangular shape.

16. The acoustic transducer of claim 14, wherein the corresponding top surface of each of the plurality of cantilevered beams is a triangular shape with a triangle base at the corresponding fixed end and a tip a the corresponding deflection end; and wherein the plurality of cantilevered beams and gaps between adjacent beams of the plurality of cantilevered beams enclose a symmetrical polygonal shape.

17. The acoustic transducer of claim 1, wherein the cantilevered beam comprises a conductive contact electrically coupled to at least one conductor layer of the cantilevered beam.

18. The acoustic transducer of claim 17, further comprising an application specific integrated circuit (ASIC) coupled to the conductive contact via a bond wire.

19. The acoustic transducer of claim 18, further comprises a package lid and a package substrate surrounding the cantilevered beam, wherein the silicon substrate is mounted to the package substrate.

20. The acoustic transducer of claim 19, wherein the package substrate comprises a portion of the acoustic aperture configured to provide an acoustic path to the cantilevered beam.

21. The acoustic transducer of claim 20, wherein the acoustic aperture forms a via through the silicon substrate.

22. The acoustic transducer of claim 18, further comprising processing circuitry and a display screen coupled to the ASIC.

23. The acoustic transducer of claim 1, wherein an edge of the first silicon oxide layer, an edge of the polysilicon layer and an edge of the second silicon oxide layer formed by top-side etching align with the edge of the silicon substrate along a boundary between the first portion of the bottom surface of the cantilevered beam and the second portion of the bottom surface of the cantilevered beam.

24. The acoustic transducer of claim 23, wherein the edge of the second silicon oxide layer modifies a resonance of the acoustic transducer by modifying a resonance frequency of the cantilevered beam.

25. An acoustic transducer comprising:

a silicon substrate having a top surface and a bottom surface, wherein the top surface has a first portion and an edge associated with an acoustic aperture;

a first silicon oxide layer formed over the first portion of the top surface of the silicon substrate;

a polysilicon layer formed over the first silicon oxide layer;

a second silicon oxide layer formed over the polysilicon layer; and a plurality of cantilevered beams each comprising a fixed end, a deflection end, a top surface, and a bottom surface, wherein the fixed end of each cantilevered beam is disposed on the second silicon oxide layer and formed over the first portion of the silicon substrate, and wherein the deflection end of each cantilevered beam is formed over the acoustic aperture, and wherein the polysilicon layer forms at least a portion of a support stack configured to support the fixed end of each of the plurality of cantilevered beams.

26. The acoustic transducer of claim 25, further comprises a package lid and a package substrate surrounding the plurality of cantilevered beams, wherein the silicon substrate is mounted to the package substrate; and wherein the package substrate comprises an acoustic aperture configured to provide an acoustic path to the plurality of cantilevered beams.

27. The acoustic transducer of claim 25, wherein the acoustic transducer is a piezoelectric micromachined ultrasonic transducer (PMUT) device configured to operate with an ultrasonic resonance frequency at or above 40 kilohertz (kHz).

* * * * *